(12) United States Patent
You et al.

(10) Patent No.: US 10,879,118 B2
(45) Date of Patent: Dec. 29, 2020

(54) SEMICONDUCTOR DEVICE AND METHOD OF FABRICATING THE SAME

(71) Applicant: TAIWAN SEMICONDUCTOR MANUFACTURING CO., LTD., Hsinchu (TW)

(72) Inventors: Jia-Chuan You, Taoyuan (TW); Chia-Hao Chang, Hsinchu (TW); Wai-Yi Lien, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/390,097

(22) Filed: Apr. 22, 2019

(65) Prior Publication Data

US 2019/0252250 A1    Aug. 15, 2019

Related U.S. Application Data

(63) Continuation of application No. 15/605,995, filed on May 26, 2017, now Pat. No. 10,269,636.

(51) Int. Cl.
| | |
|---|---|
| *H01L 21/768* | (2006.01) |
| *H01L 29/78* | (2006.01) |
| *H01L 29/739* | (2006.01) |
| *H01L 29/66* | (2006.01) |
| *H01L 29/49* | (2006.01) |
| *H01L 23/535* | (2006.01) |

(52) U.S. Cl.
CPC .. *H01L 21/76895* (2013.01); *H01L 21/76805* (2013.01); *H01L 21/76829* (2013.01); *H01L 21/76843* (2013.01); *H01L 21/76897* (2013.01); *H01L 23/535* (2013.01); *H01L 29/4983* (2013.01); *H01L 29/6653* (2013.01); *H01L 29/66545* (2013.01); *H01L 29/7391* (2013.01); *H01L 29/7851* (2013.01)

(58) Field of Classification Search
CPC ............ H01L 21/76895; H01L 23/535; H01L 29/4983; H01L 21/76829; H01L 21/76897; H01L 29/6653; H01L 29/66545; H01L 29/7391; H01L 29/7851; H01L 21/76805; H01L 21/76843
USPC ........................................................ 257/382
See application file for complete search history.

(56) References Cited

U.S. PATENT DOCUMENTS

| | | |
|---|---|---|
| 7,772,702 B2 | 8/2010 | Bielefeld et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |

(Continued)

*Primary Examiner* — Igwe U Anya
(74) *Attorney, Agent, or Firm* — McClure, Qualey & Rodack, LLP

(57) ABSTRACT

A semiconductor device includes a semiconductor substrate, a source/drain over the semiconductor substrate, a bottom conductive feature over the source/drain, a gate structure over the semiconductor substrate, a first spacer between the gate structure and the bottom conductive feature, a second spacer over the first spacer, and a contact plug landing on the bottom conductive feature and the second spacer. A top surface of the gate structure is free from coverage by the second spacer.

20 Claims, 22 Drawing Sheets

(56) References Cited

U.S. PATENT DOCUMENTS

| | | |
|---|---|---|
| 8,962,464 B1 | 2/2015 | Chang et al. |
| 9,064,801 B1 | 6/2015 | Horak et al. |
| 9,105,490 B2 | 8/2015 | Wang et al. |
| 9,236,267 B2 | 1/2016 | De et al. |
| 9,236,300 B2 | 1/2016 | Liaw |
| 9,379,058 B2 | 6/2016 | Song et al. |
| 9,461,143 B2 * | 10/2016 | Pethe ................ H01L 21/76895 |
| 9,520,482 B1 | 12/2016 | Chang et al. |
| 9,576,814 B2 | 2/2017 | Wu et al. |
| 9,824,921 B1 * | 11/2017 | Labonte ............ H01L 21/76802 |
| 9,929,048 B1 * | 3/2018 | Xie ................... H01L 21/76805 |
| 2007/0257368 A1 | 11/2007 | Hussein et al. |
| 2014/0077305 A1 * | 3/2014 | Pethe ................ H01L 21/76897 |
| | | 257/368 |
| 2015/0137273 A1 | 5/2015 | Zhang et al. |
| 2015/0235948 A1 | 8/2015 | Song et al. |
| 2016/0133623 A1 * | 5/2016 | Xie ................... H01L 29/66545 |
| | | 257/384 |
| 2017/0004998 A1 * | 1/2017 | Pethe ................ H01L 21/76895 |
| 2017/0053997 A1 | 2/2017 | Cheng et al. |
| 2017/0054004 A1 * | 2/2017 | Cheng ............... H01L 29/66545 |
| 2018/0174904 A1 * | 6/2018 | Hsieh .................... H01L 29/785 |
| 2018/0301371 A1 * | 10/2018 | Wang ................ H01L 21/76816 |

\* cited by examiner

SEMICONDUCTOR DEVICE AND METHOD OF FABRICATING THE SAME

CROSS-REFERENCE TO RELATED APPLICATION

This application is a continuation of U.S. patent application Ser. No. 15/605,995, filed May 26, 2017, issued as U.S. Pat. No. 10,269,636 on Apr. 23, 2019, which is herein incorporated by reference in its entirety.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide used in larger technology nodes.

However, there are challenges to implementing such features and processes in complementary metal-oxide-semiconductor (CMOS) fabrication. As the gate length and spacing between devices decrease, these problems are exacerbated. For example, source/drain regions may short to metal gate structures due to misalignment of contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
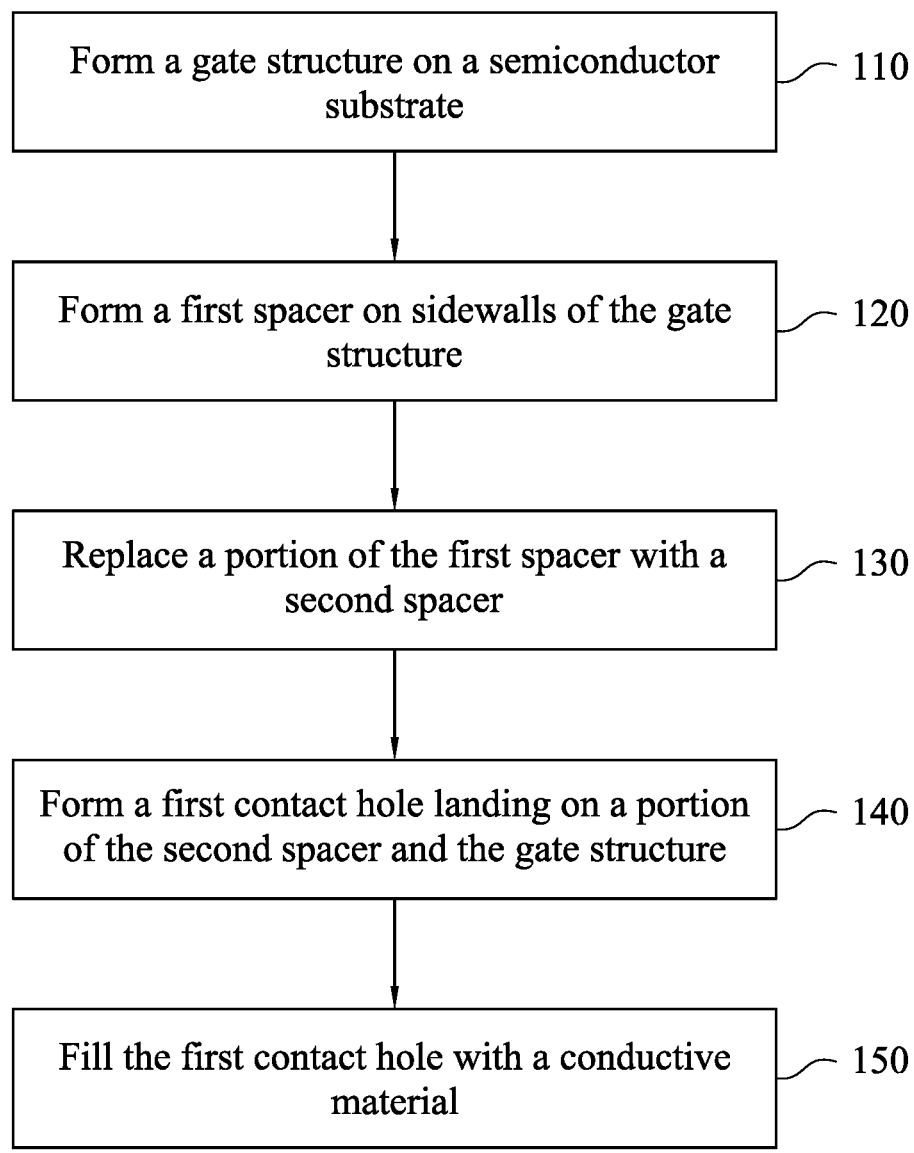
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Referring to FIG. 1, a flow chart of a method 100 of fabricating a semiconductor device in accordance with some embodiments of the instant disclosure. The method begins with operation 110 in which a gate structure is formed on a semiconductor substrate. The method continues with operation 120 in which a first spacer is formed on sidewalls of the gate structure. Subsequently, operation 130 is performed. A portion of the first spacer is replaced with a second spacer. The method continues with operation 140 in which a first contact hole is formed. The first contact hole has a portion landing on the second spacer and the gate structure. The method continues with operation 150 in which a conductive material is filled into the first contact hole. The discussion that follows illustrates embodiments of semiconductor devices that can be fabricated according to the method 100 of FIG. 1.

Figure 2:
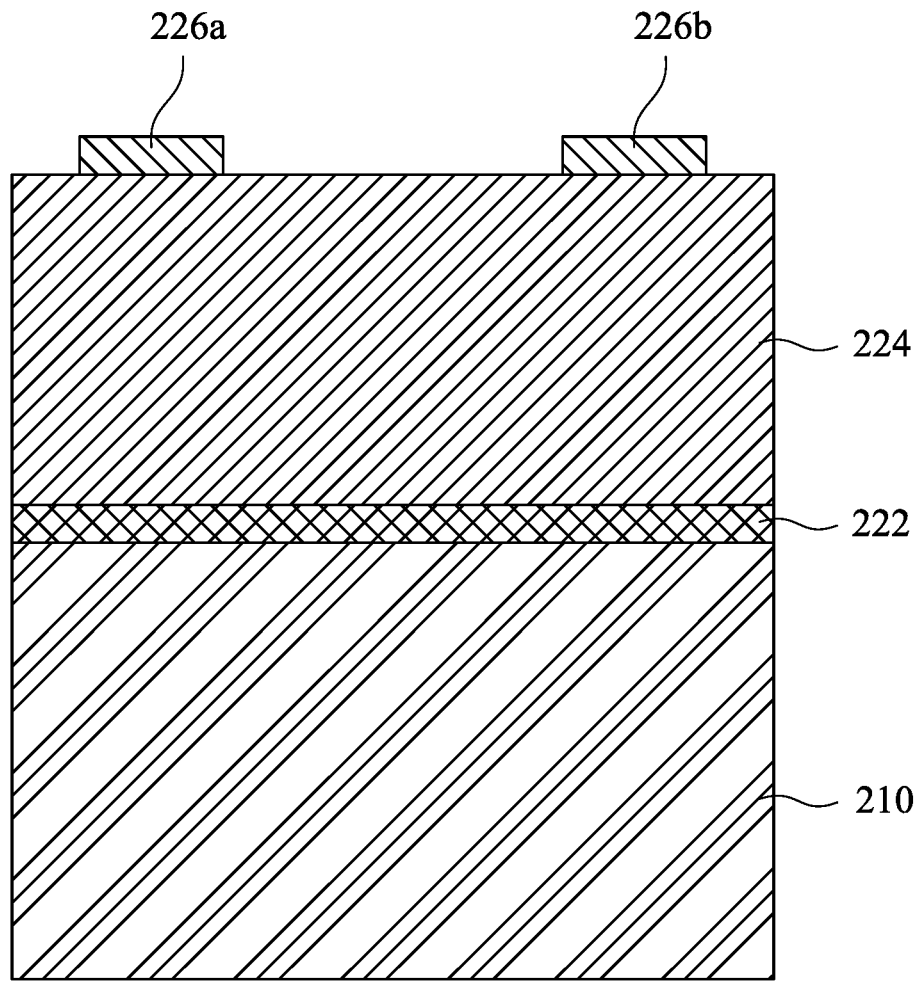
FIG. 2 is a perspective view of a semiconductor device in accordance with some embodiments.

Reference is made to FIG. 2 and operation 110 of FIG. 1. A cross-sectional view of an example FinFET device 200 is illustrated. The FinFET device 200 is a non-planar multi-gate transistor that is built on a semiconductor substrate (not shown). The semiconductor substrate is patterned to form a fin structure 210. The fin structure 210 extends in an elongate manner. The fin structure 210 forms the body of the FinFET device 200. A high-k dielectric layer 222 is formed around the fin structure 210, and a dummy gate layer 224 is formed on the high-k dielectric layer 222. The high-k dielectric layer 222 includes a material having a dielectric constant, k, of at least or equal to about 6. Examples of high-k dielectric material include hafnium-based materials such as $HfO_2$, $HfSiO$, $HfSiON$, $HfTaO$, $HfTiO$, $HfZrO$, and $HfO_2Al_2O_3$ alloy. Additional examples of high-k dielectrics include $ZrO_2$, $Ta_2O_5$, $Al_2O_3$, $Y_2O_3$, $La_2O_3$, and $SrTiO_3$. The high-k dielectric layer 222 and the dummy gate layer 224 may each be formed using a deposition process, for example chemical vapor deposition (CVD), physical vapor deposition (PVD), atomic layer deposition (ALD), combinations thereof, or another suitable process. The FinFET device 200 includes masks 226a and 226b for the patterning of the dummy gate structures 220a and 220b.

Figure 3:
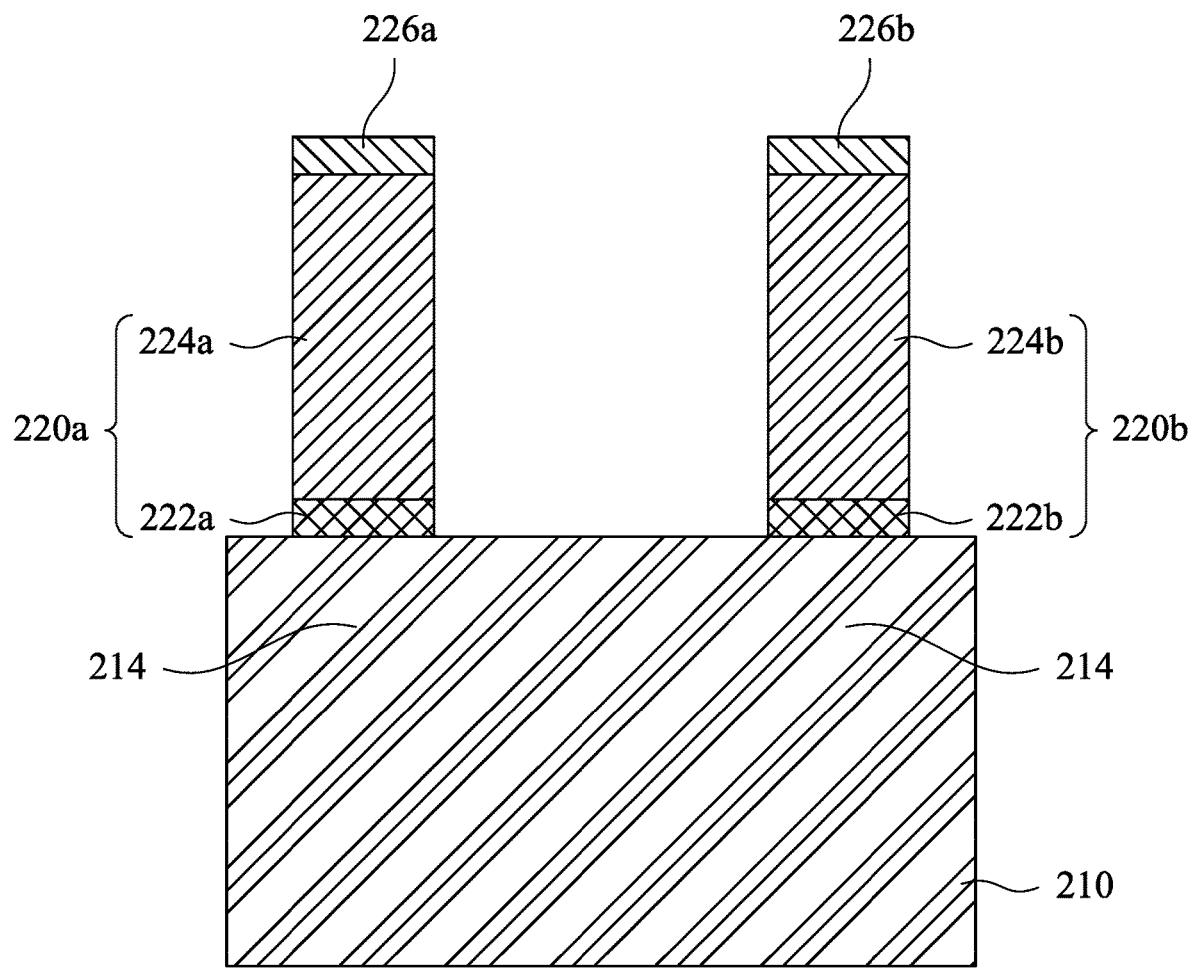
FIGS. 3-22 are cross-sectional views of a portion of a semiconductor device at various stages in a spacer formation process in accordance with some embodiments of the instant disclosure.

Reference is made to FIG. 3 and operation 110 of FIG. 1. For forming the dummy gate structures 220a and 220b, a patterning process is performed. The patterning can be accomplished by a photolithographic process. The high-k dielectric layer 222 and dummy gate layer 224 are etched according to the pattern of masks 226a and 226b. Any etch process or combination of etch processes can be used in the patterning process. After the patterning, a first dummy gate structure 220a and a second dummy gate structure 220b are formed. The first and second dummy gate structures 220a and 220b are elongated bars crossing the fin structure 210 in substantially perpendicular manner. The first and second dummy gate structures 220a and 220b are gate electrodes having longitudinal directions parallel to each other. The first and second dummy gate structures 220a and 220b define the channel region 214 of the fin structure 210. The first dummy gate structure 220a includes the high-k dielectric layer 222a, the dummy gate layer 224a, and mask 226a. The second dummy gate structure 220b includes the high-k dielectric layer 222b, the dummy gate layer 224b, and mask 226b.

Figure 4:
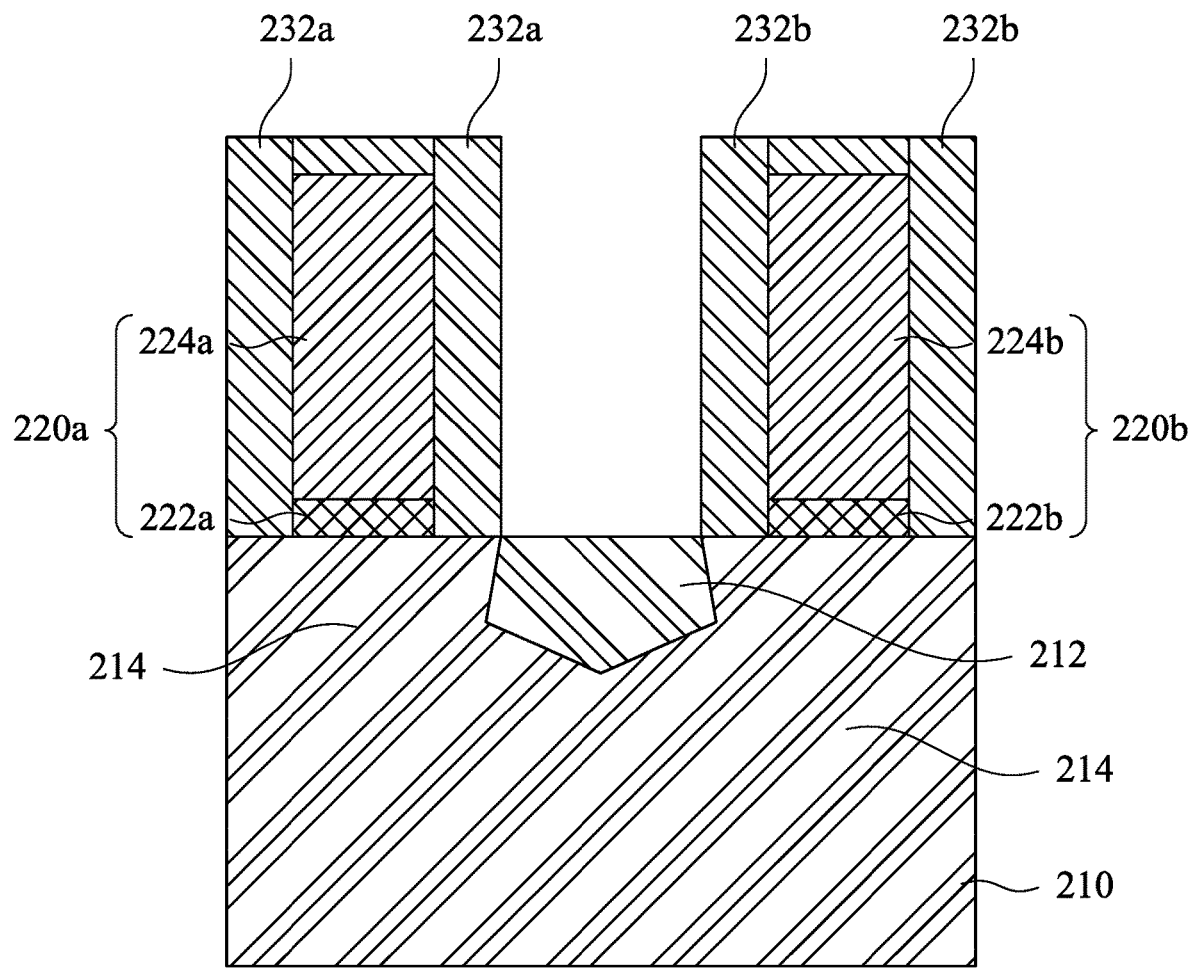

Reference is made to FIG. 4. An ion implantation process may be performed to form lightly doped drain (LDD) regions (not shown). The first and second dummy gate structures 220a and 220b are used as masks to help control the implant profile and distribution. First spacers 232a and 232b are formed around the first and second dummy gate structures 220a and 220b respectively. A low-k spacer material is first deposited over the entire semiconductor substrate. The low-k spacer material is then etched back, and selected portions 232a and 232b of the low-k spacer material around the first and second dummy gate structures 220a and 220b remain after the etch back. The first dummy gate structure 220a is sandwiched between the first spacers 232a, and the second dummy gate structure 220b is sandwiched between the second spacers 232b. Examples of low-k spacer materials include, but are not limited to, SiOC and SiOCN. The thickness of the first spacers 232a and 232b is measured of between approximately 5 and 10 nm.

Reference is still made to FIG. 4 and operation 110 and 120 in FIG. 1. An active region is formed in the semiconductor substrate. An active region includes a channel region, a source region and a drain region of the FinFET device 200. The source region and drain region are formed in extensions of the fin structure 210 on opposite sides of the dummy gate structures 220a and 220b. The effective channel length of the FinFET device 200 is determined by the dimensions of the fin structure 210. As shown in FIG. 4, the source/drain region 212 is formed in the fin structure 210. The formation of source/drain region 212 may be achieved by etching the fin structure 210 to form recesses therein, and then performing an epitaxy to grow the source/drain region 212 in the recesses. For the sake of clarity, only a portion of the active region is shown throughout FIGS. 4-20.

Figure 5:
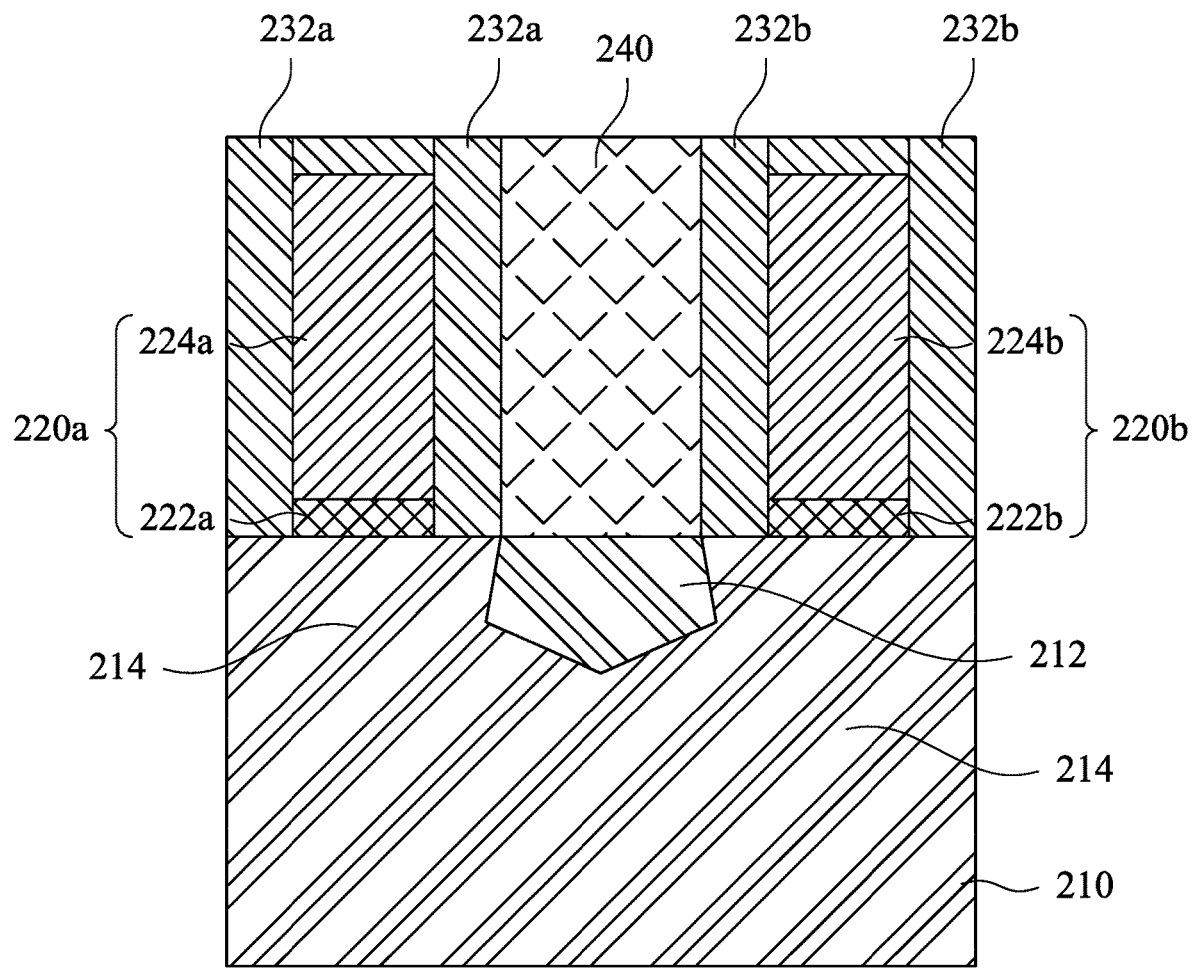

Reference is made to FIG. 5. A first interlayer dielectric (ILD) layer 240 is formed. The first ILD layer 240 may comprise a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or combinations thereof. It is understood that the first ILD layer 240 may comprise one or more dielectric materials and/or one or more dielectric layers. In some embodiments, the first ILD layer 240 may be deposited to a suitable thickness by CVD, high density plasma (HDP) CVD, sub-atmospheric CVD (SACVD), spin-on, sputtering, or other suitable methods. The first ILD layer 240 adheres well to the first and second spacers 232a and 232b and over the top of the masks 226a and 226b. After the first ILD layer 240 is formed, an upper surface of the semiconductor substrate is planarized to lower the surface to the level of the first and second dummy gate structures 220a and 220b. The planarization is accomplished by, for example, chemical mechanical polishing (CMP). After planarizing, the mask 226a and 226b are removed, and the dummy gate layers 224a and 224b, the first and second spacers 232a and 232b, and the first ILD layer 240 all approximately have the same height.

Figure 6:
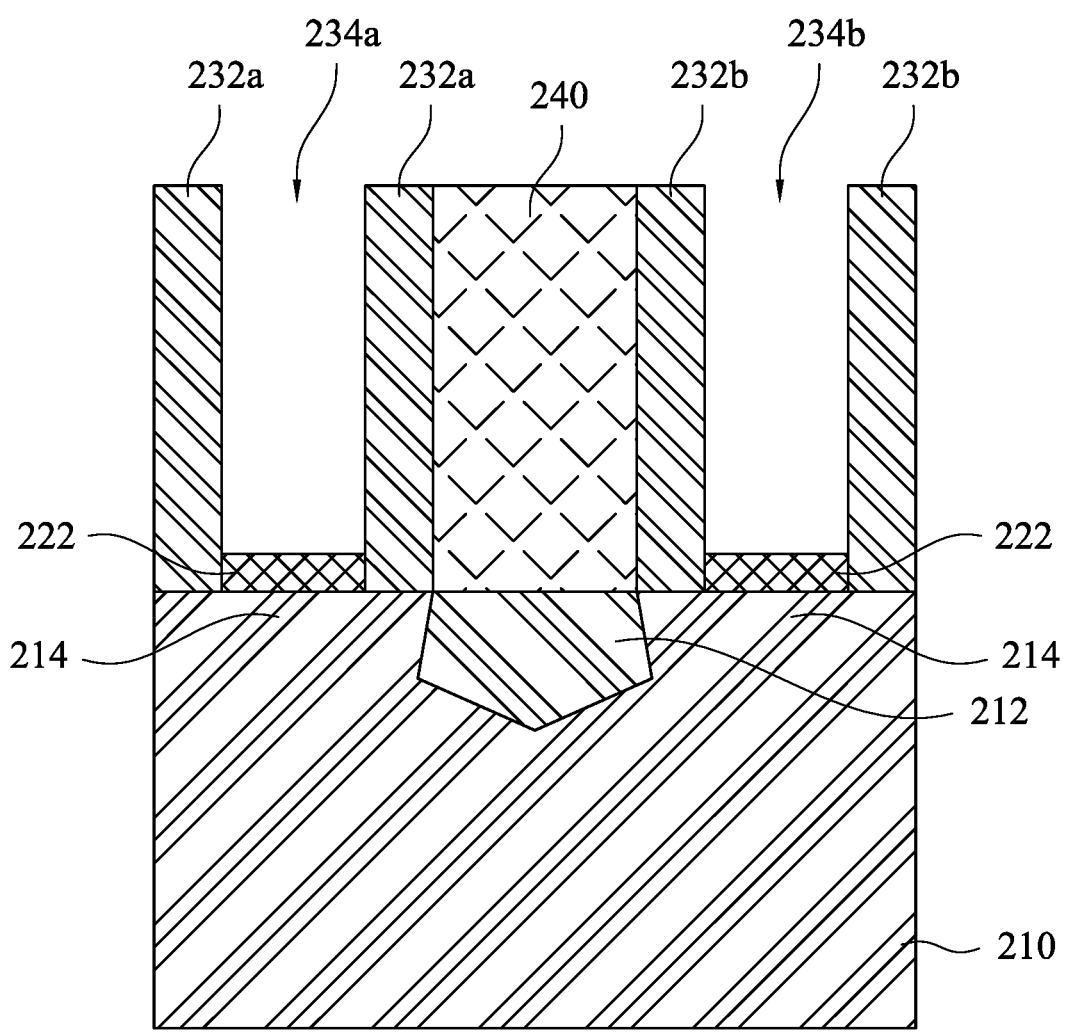

Reference is made to FIG. 6. The dummy gate layers 224a and 224b are removed to form recesses 234a and 234b. The dummy gate layers 224a and 224b are removed in one or many etch operations including wet etch and dry etch. According to various embodiments, a hard mask is patterned over the fin structure 210 to protect the first ILD layer 240 and the first and second spacers 232a and 232b. The dummy gate layer etch may stop at the high-k dielectric layers 222a and 222b. In some embodiments, the high-k dielectric layers 222a and 222b may be removed along with the dummy gate layers 224a and 224b. Recess 234a and 234b are formed between the first spacers 232a and 232b respectively.

Figure 7:
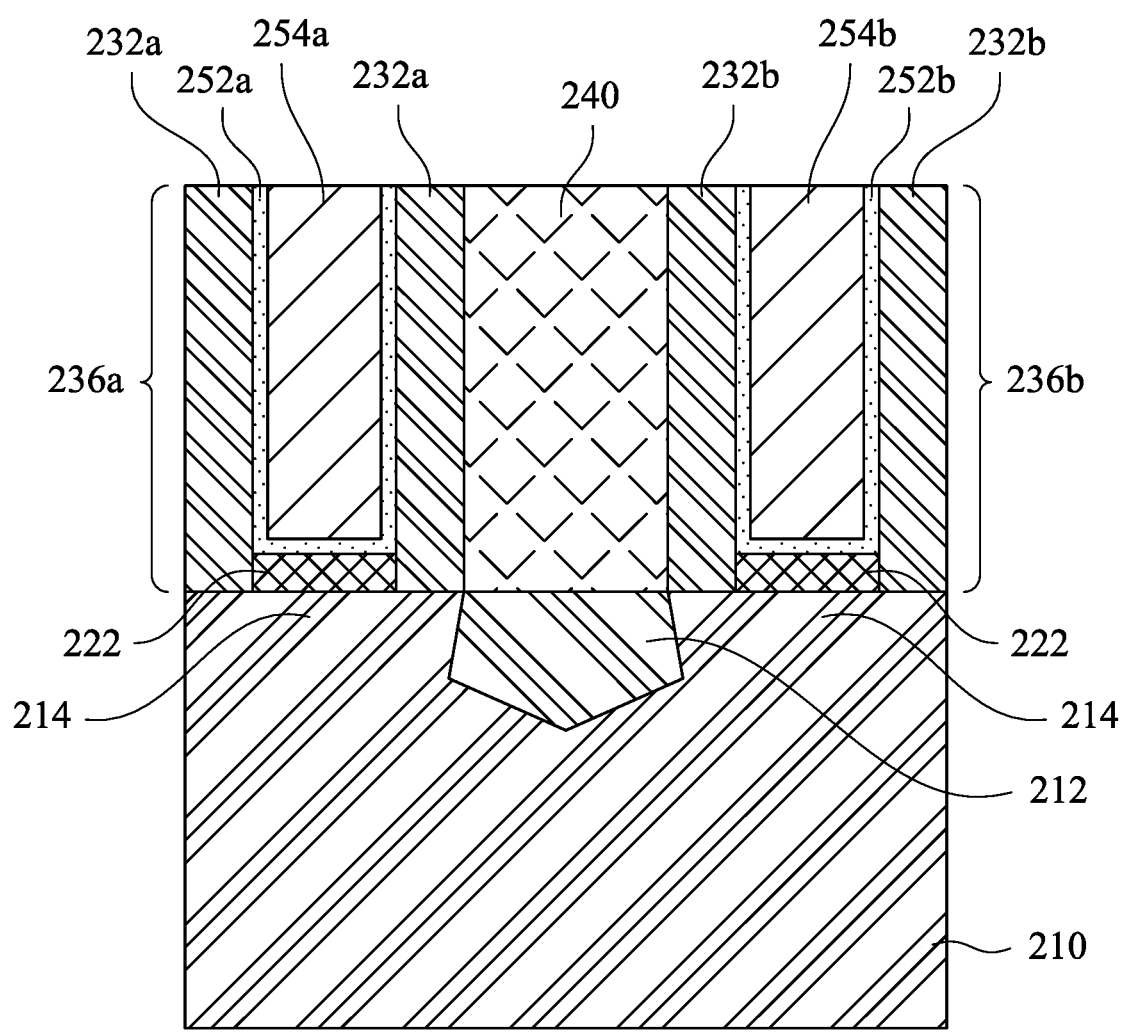

Reference is made to FIG. 7. A metal layer may be formed to fill in the recesses 234a and 234b. The metal layer overfills the recesses 234a and 234b, and next a planarization process is performed. As shown in FIG. 7, work function metal layers 252a and 252b are formed in the recesses 234a and 234b and cover the high-k dielectric layers 222a and 222b and sidewalls of the first spacers 232a and 232b. Subsequently, the metal gate electrode layers 254a and 254b are formed in the recesses 234a and 234b. The work function metal layers 252a and 252b may be formed by conformally deposited a work function material layer on the semiconductor substrate. The overfilled work function metal material layer and the metal gate electrode material layer are pulled back by, for example, etching, to form the first and second gate stacks 236a and 236b in the recesses 234a and 234b respectively. The top surface of the metal gate electrode layers 254a and 254b is level with the top surface of the first ILD layer 240. The first and second gate stacks 236a and 236b are high-k metal gates. The metal layer may include any metal material suitable for forming metal gate electrode layers 254a and 254b or portions thereof, including liner layers, interface layers, seed layers, adhesion layers, barrier layers, etc. In some embodiments, the metal layer may include suitable metals, such as TiN, WN, TaN, or Ru that properly perform in the PMOSFET. In some alternative embodiments, the metal layer may include suitable metals, such as Ti, Ag, Al, TiAl, TiAlN, TiAlC, TiAlCN, TaC, TaCN, TaSiN, Mn, or Zr that properly perform in the NMOSFET.

Figure 8:
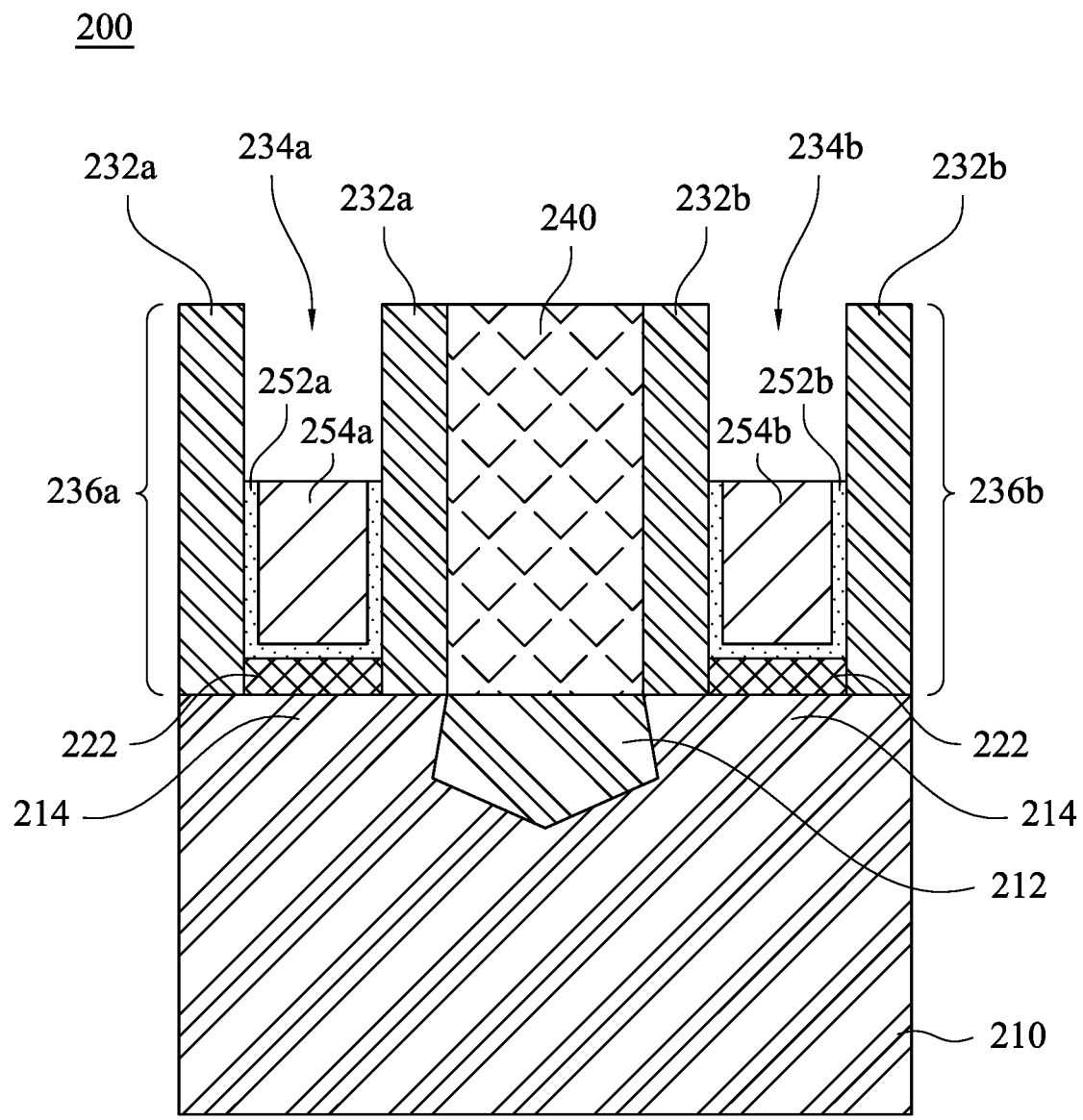

Reference is made to FIG. 8 and operation 130 in FIG. 1. An etching back is performed to remove a portion of the metal gate electrode layers 254a and 254b and the work function metal layer 252a and 252b. A mask layer may be used in the etching process. The metal gate electrode layers 254a and 254b and work function metal layer 252a and 252b are brought down to a level approximately half the height of the first spacers 232a and 232b. The recesses 234a and 234b reappear with shallower depth. The top surface of the metal gate electrode layers 254a and 254b is no longer level with the first ILD layer 240. An upper portion of the first spacers 232a and 232b is then exposed from the work function metal layers 252a and 252b.

Figure 9:
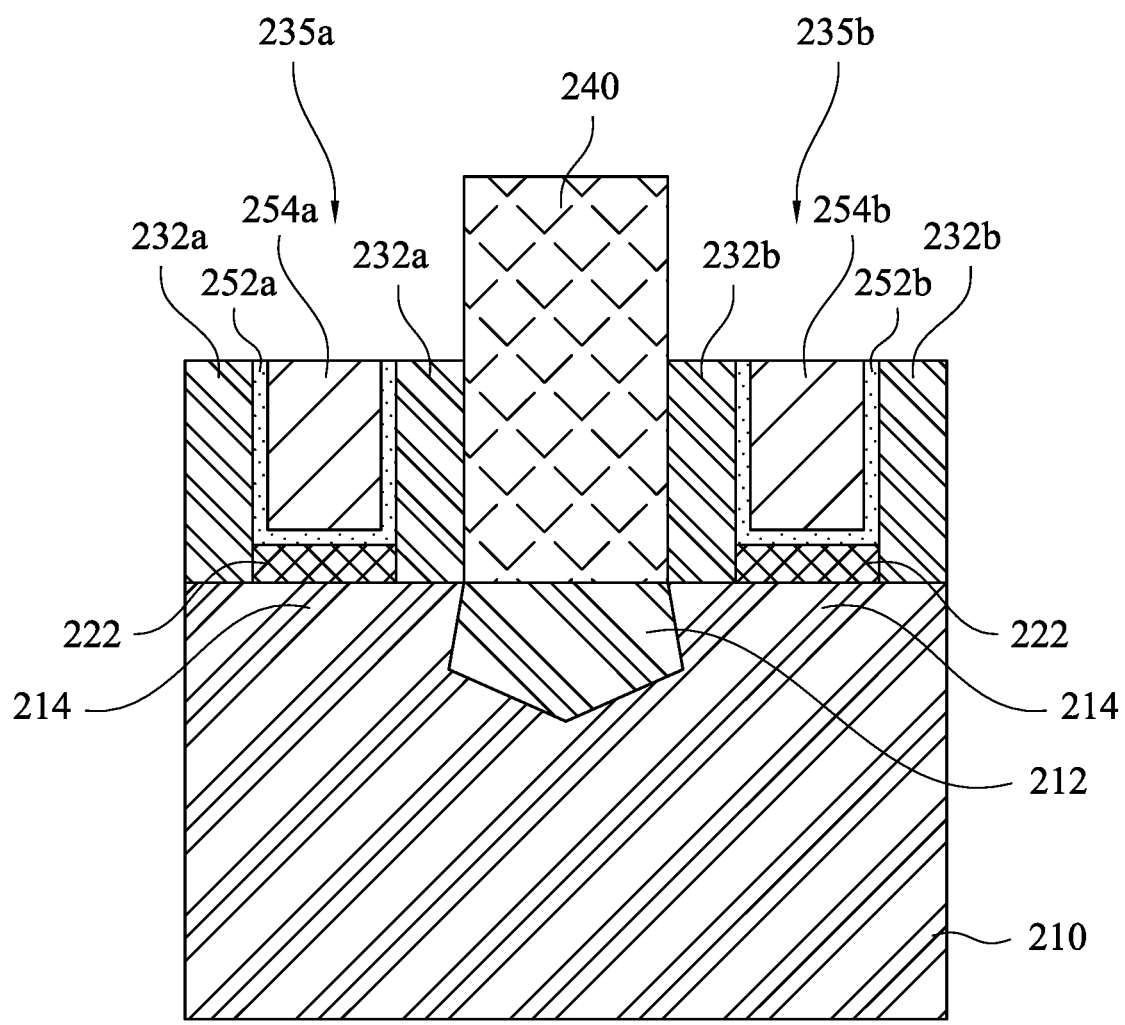

Reference is made to FIG. 9 and operation 130 in FIG. 1. A lateral etching is performed to remove the upper portion of the first spacers 232a and 232b. After metal gate electrode layers 254a and 254b etching back, the upper portion of the first spacers 232a and 232b, which is not attached to the metal gate electrode layers 254a and 254b, is removed by lateral etching. The lateral etching has milder impact to the underlying metal gate electrode layers 254a and 254b. In addition, first spacers 232a and 232b that is attached to the metal gate electrode layers 254a and 254b are retained after lateral etching. The lateral etching results in formation of recesses 235a and 235b, which have wider opening diameter defined by first ILD layer 240.

Figure 10:
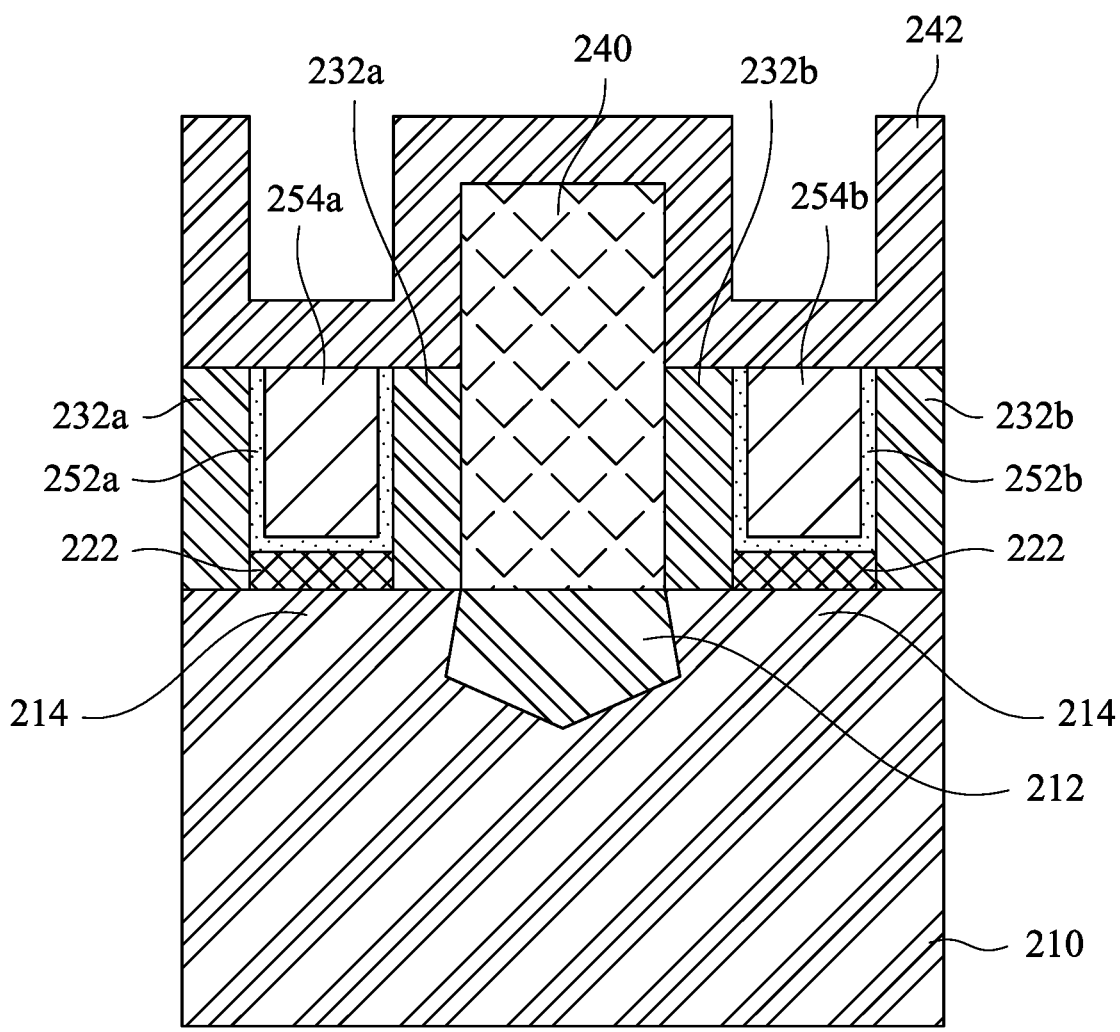

Reference is made to FIG. 10 and operation 130 of FIG. 1. A second spacer material 242 is conformally deposited on the FinFET device 200. The second spacer material 242 adheres to the sidewalls of first ILD layer 240 and covers the top surface of the metal gate electrode layers 254a and 254b, work function metal layers 252a and 252b and first spacers 232a and 232b. The second spacer material 242 has a thickness of between approximately 5 and 10 nm. The second spacer material is different from the first spacer material. Examples of the second spacer material include, but are not limited to, SiO, SiN, SiC, SiCN, SiON, AlO, AlON, ZrO, ZrN, and HfO.

Figure 11:
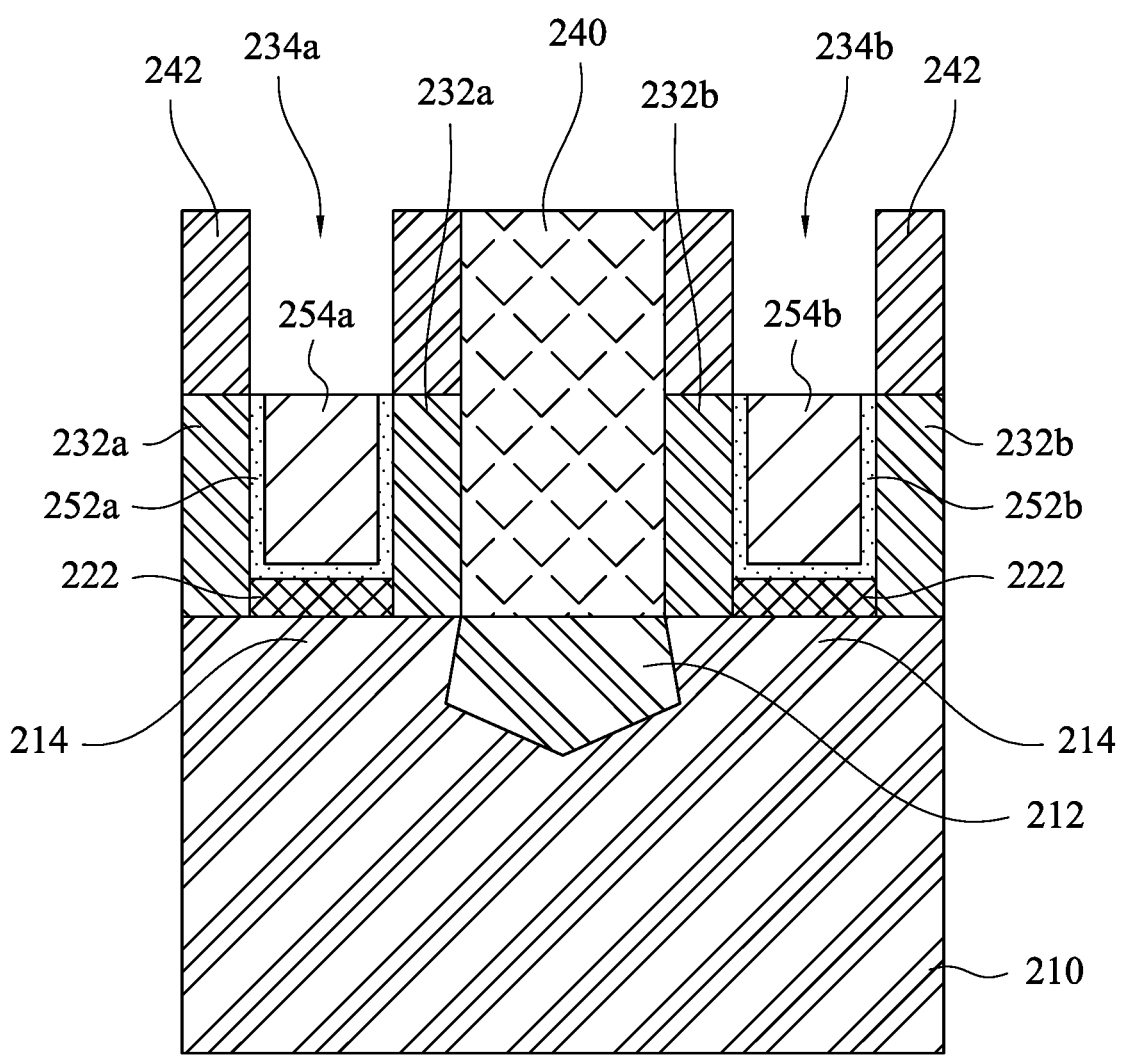

Reference is made to FIG. 11 and operation 130 of FIG. 1. An etching process is performed to remove a portion of the second spacer material 242. The second spacer material 242 on the first ILD layer 240 is removed, and the second spacer material 242 on the metal gate electrode layers 254a and 254b is removed. The metal gate electrode layers 254a and 254b and work function metal layers 252a and 252b are exposed again. The remaining second spacer material 242 is formed in the second spacers 242a and 242b. The second spacers 242a and 242b stand on the first spacers 232a and 232b, such that the first spacers 232a and 232b are not exposed. The space left by the first spacers 232a and 232b is replaced by the second spacers 242a and 242b, the second spacers 242a and 242b cover the top surface of the first spacers 232a and 232b. The recesses 234a and 234b reappear, and the second spacers 242a and 242b and the metal gate electrode layers 254a and 254b define the outline of the recesses 234a and 234b. The entire spacer structure is constituted of two layers of different spacer materials. The lower one is the first spacers 232a and 232b, and the upper one is the second spacers 242a and 242b.

Figure 12:
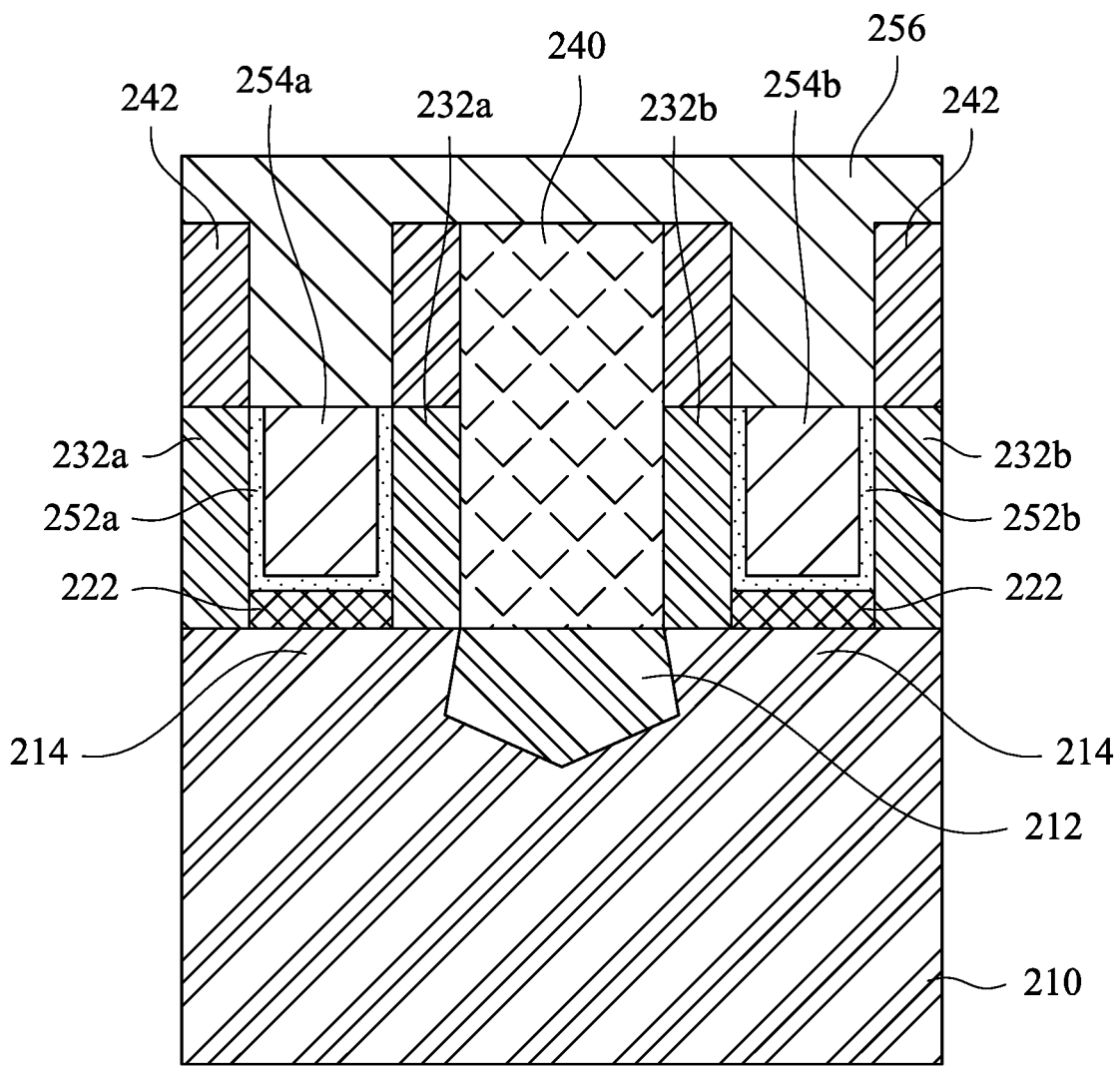

Reference is made to FIG. 12. A first hard mask 256 fills in the remaining of the recesses 234a and 234b. A material of the first hard mask includes, for example, SiO, SiN, SiOC, and SiOCN. The first hard mask layer 256 serves to protect the underlying components like the metal gate electrode layers 254a and 254b in the subsequent via formation process. An etching selectivity between the second spacers 242a and 242b and the first hard masks 256a and 256b is larger than approximately 10. For example, the first hard masks 256a and 256b may include SiO, and the second spacers 242a and 242b may include ZrO. The second spacers 242a and 242b and the first hard masks 256a and 256b serve as a protection layer to its underlying components, for example, metal gate electrode layers 254a and 254b and the first spacers 232a and 232b.

Figure 13:
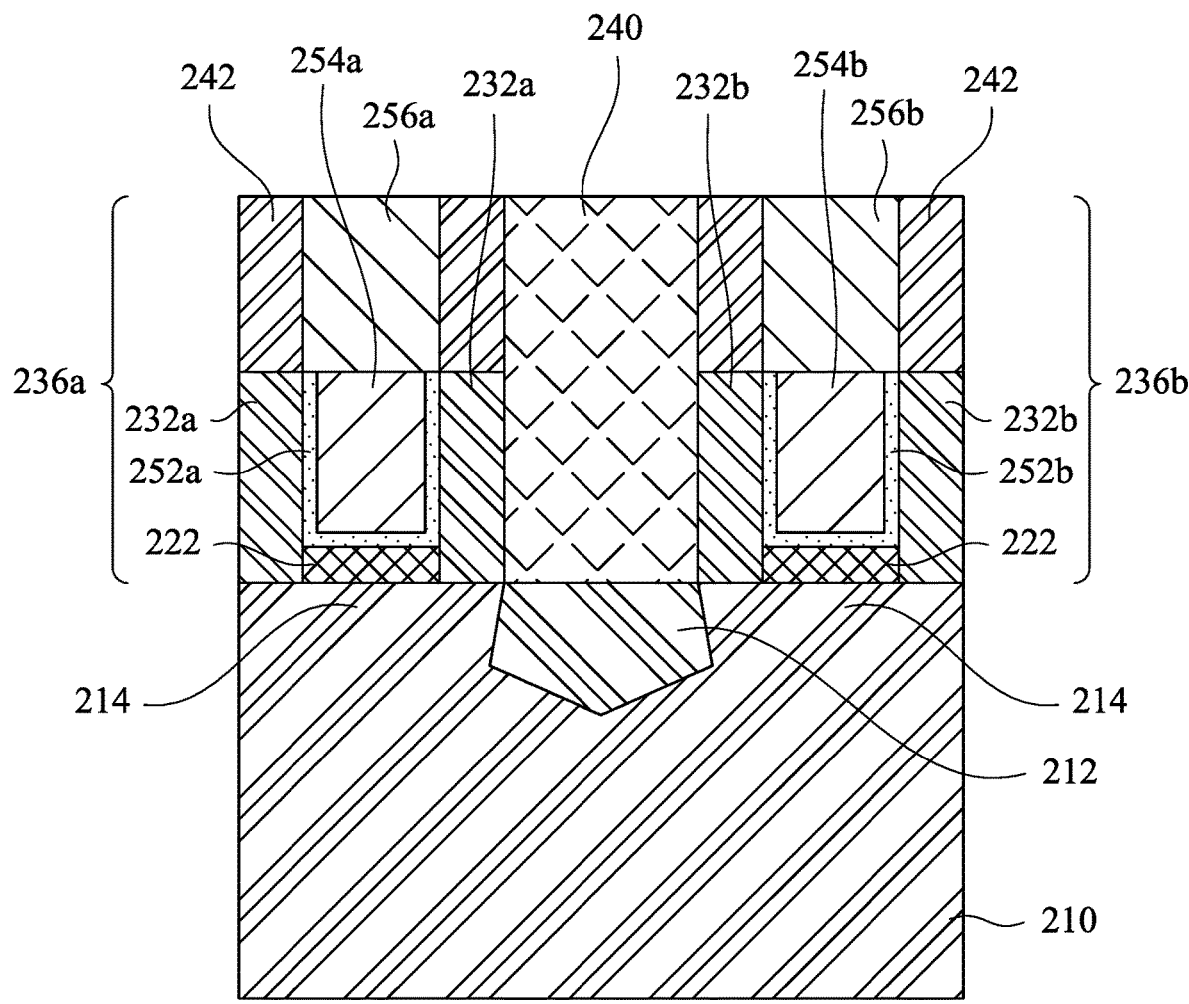

Reference is made to FIG. 13. A polishing process, for example, CMP is performed, and the first hard mask 256 is lowered to level with the second spacers 242a and 242b. The first gate stack 236a includes the high-k dielectric layer 222a, metal gate electrode layer 254a and first hard mask 256a. The first gate stack 236a is flanked by the first spacers 232a and second spacers 242a. The second gate stack 236b includes the high-k dielectric layer 222b, metal gate electrode layer 254b and first hard mask 256b. The second gate stack 236b is flanked by the first spacers 232b and second spacers 242b.

Figure 14:
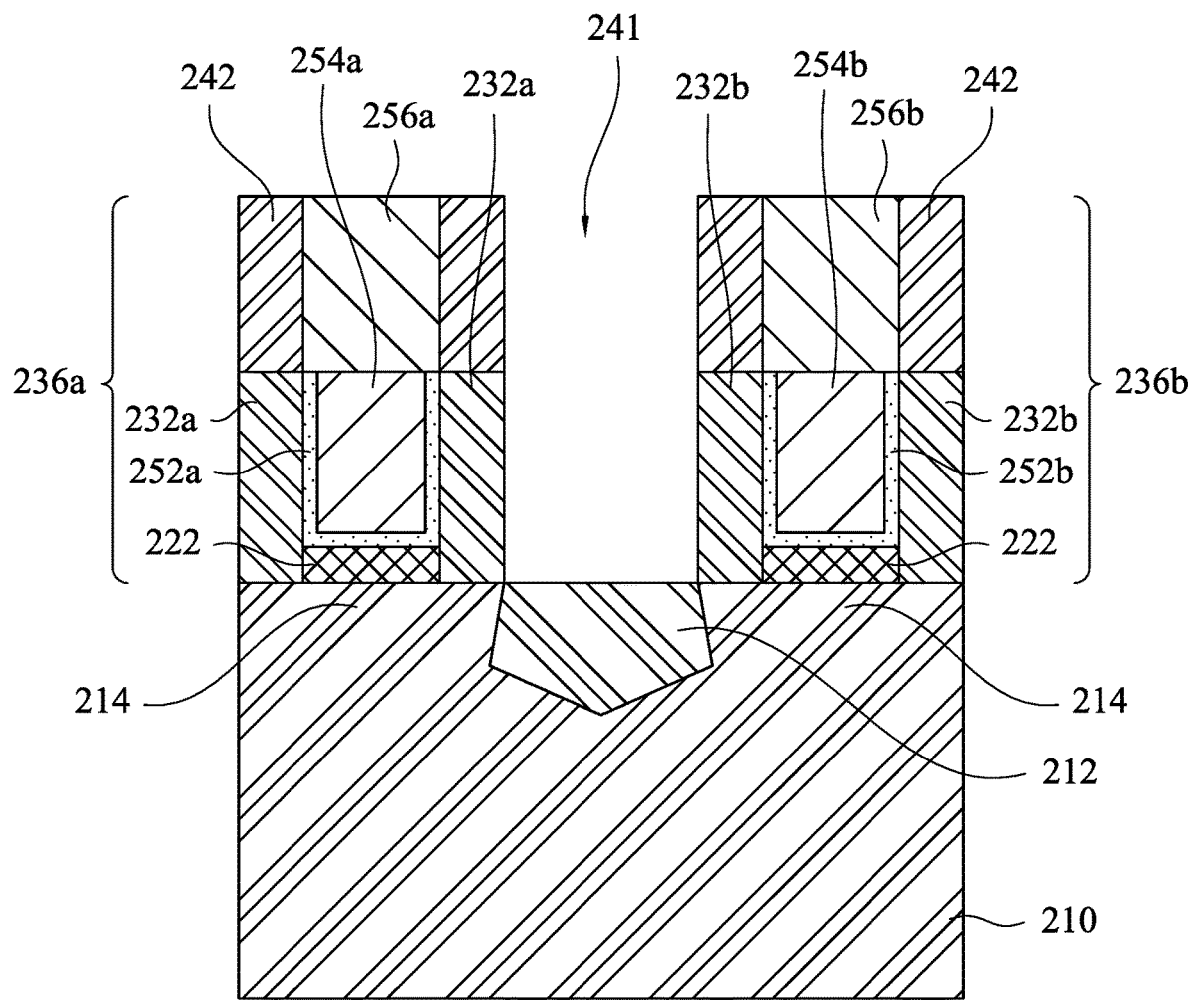

Reference is made to FIG. 14. The first ILD layer 240 is removed. The first ILD layer 240 may be removed by etching back. The first and second gate stacks 236a and 236b are protected by the first hard masks 256a and 256b and remain intact during the first ILD layer 240 removal. The removal of the first ILD layer 240 results in the formation of an opening 241 and the exposure of the underlying source/drain region 212 (active region) in the fin structure 210 as shown in FIG. 14.

Figure 15:
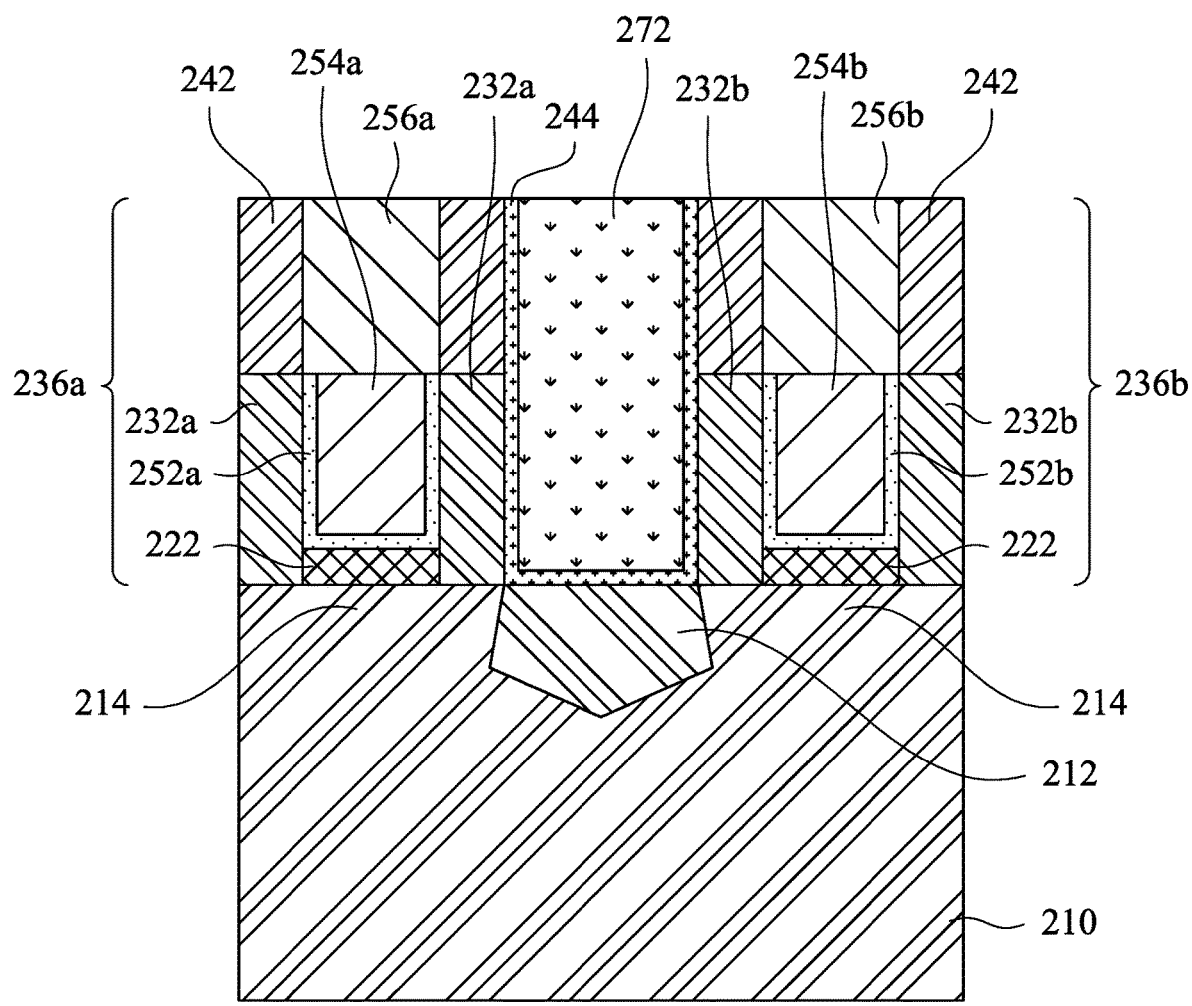

Reference is made to FIG. 15. A first barrier layer 244 is deposited on the FinFET device 200. The first barrier layer 244 lines the sidewalls of the first and second spacers 232a, 232b, 242a and 242b and the bottom of the opening 241. In some embodiment, the first barrier layer 244 has a thickness of about 10 angstroms to about 300 angstroms. In some embodiments, the first barrier layer 244 is a metal or metal alloy layer. The first barrier layer 244 may include cobalt (Co), silver (Ag), aluminum (Al), zinc (Zn), calcium (Ca), gold (Au), magnesium (Mg), tungsten (W), molybdenum (Mo), nickel (Ni), chromium (Cr), or the like, which may be deposited by using e.g., PVD, CVD, plasma enhanced CVD (PECVD), low pressure CVD (LPCVD), or the like.

Reference is still made to FIG. 15. A bottom conductive feature 272 is deposited on the first barrier layer 244. The opening 241 left after the removal of the first ILD layer 240 is replaced by the bottom conductive feature 272. The bottom conductive feature 272 is wrapped around in the pocket lined by the first barrier layer 244. The bottom conductive feature 272 includes electrically conductive materials and provides electrical connection to the source/drain region 212. Top surfaces of the bottom conductive feature 272 and the first barrier layer 244 are level with the first and second helmet layers 260a and 260b. The bottom conductive feature 272 serves to communicate between lateral components on the active region.

Figure 16:
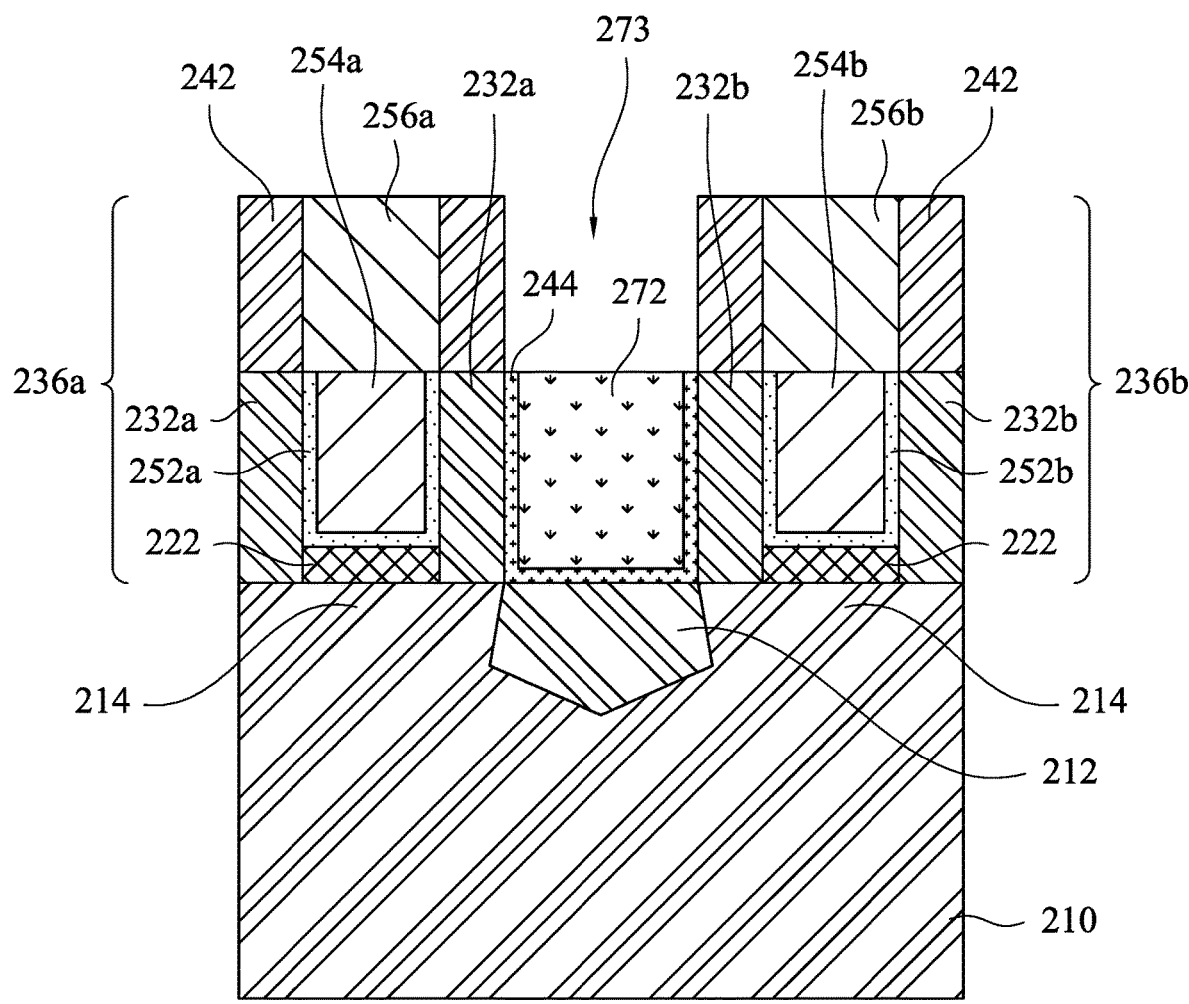

Reference is made to FIG. 16. An etching back is performed to remove a portion of the bottom conductive feature 272 and the first barrier layer 244. The top surface of the bottom conductive feature 272 and the first barrier layer 244 are brought down to level with the first spacers 232a and 232b. The height of the bottom conductive feature 272 and the first barrier layer 244 is lower than the bottoms of the first hard masks 256a and 256b. After etching back, the second spacers 242a and 242b are bare and free of the first barrier layer 244 and bottom conductive feature 272. An opening 273 is formed after the removal of the portion of the bottom conductive feature 272. The opening 273 is defined by the top surface of the bottom conductive feature 272 (first barrier layer 244) and the sidewalls of the second spacers 242a and 242b.

Figure 17:
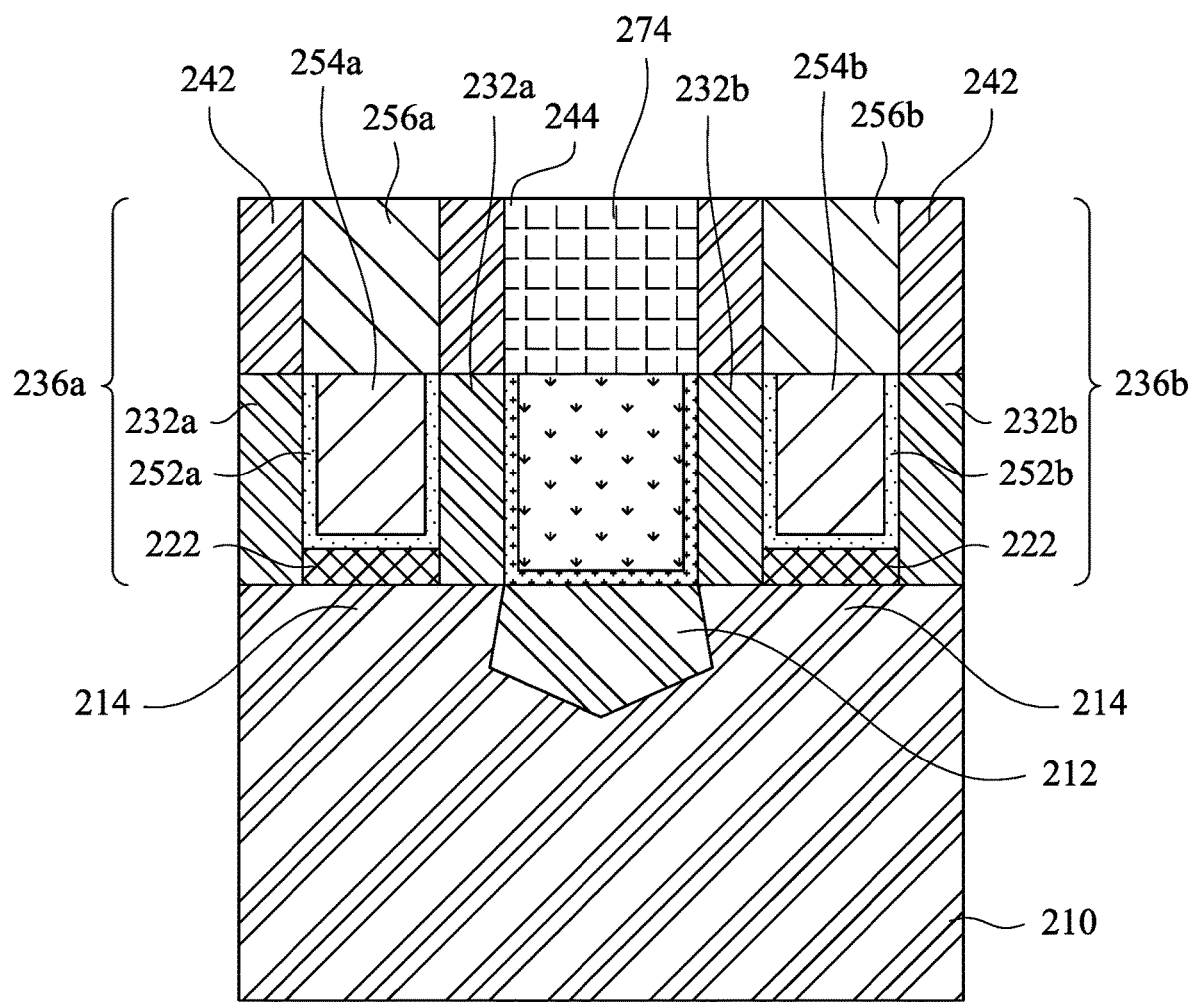

Reference is made to FIG. 17. A second hard mask material fills in the opening 273 overlying the bottom conductive feature 272 and the first barrier layer 244. A polishing process, for example, CMP is performed, and the second hard mask material is lowered to level with the top surface of the neighbouring helmet layers 260a and 260b. The second hard mask 274 is therefore formed. A material of the second hard mask 274 includes, for example, SiO, SiN, SiOC, and SiOCN. The second hard mask 274 serves to protect the underlying components like bottom conductive feature 272 and the active devices during subsequent via formation process. The material of the first hard masks 256a and 256b and the second hard mask 274 may be the same. For example, when the first hard masks 256a and 256b contain a material of SiN, the second hard mask 274 may be made of SiN as well. In some embodiments, the first hard masks 256a and 256b is made of SiOCN, and the second hard mask 274 is made of SiN. An etching selectivity between the second spacers 242a and 242b and the second hard mask 274 is greater than approximately 10. For example, when the second spacers 242a and 242b are made of AlON, the second hard mask 274 may be made of SiO.

Reference is still made to FIG. 17. The first spacers 232a and 232b are disposed on sidewalls of the gate stacks 236a and 236b respectively. The first spacers 232a and 232b are also disposed on sidewalls of the bottom conductive feature 272. The second spacers 242a and 242b are disposed on the narrow end of the first spacers 232a and 232b, adding the height to the first spacers 232a and 232b. The second spacers 242a and 242b are disposed on sidewalls of the first hard masks 256a and 256b. The second hard mask 274 is also flanked by second spacers 242a and 242b. The first and second hard masks 256a, 256b and 274 are spaced apart by the second spacers 242a and 242b.

Figure 18:
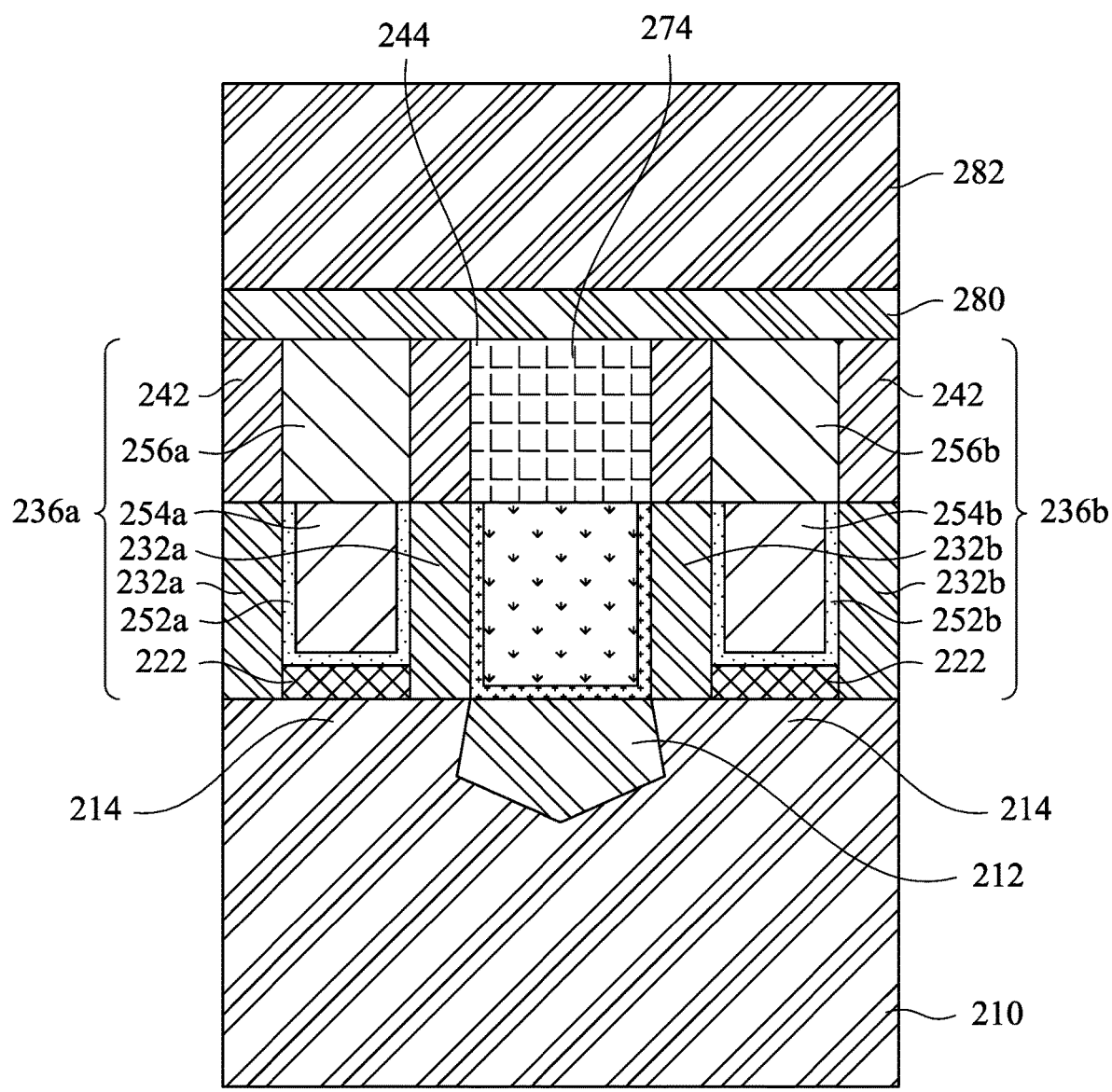

Reference is made to FIG. 18. A contact etch stop layer (CESL) 280 and a second ILD layer 282 are formed. The contact etch stop layer 280 (metal contact etch stop layer) is formed by a deposition process such as, for example, CVD, PECVD, chemical solution deposition, or evaporation. The contact etch stop layer 280 includes a material such as, for example, SiO, SiN, SiOC, and SiOCN. The contact etch stop layer 280 blankets the second spacers 242a and 242b, first hard masks 256a and 256b, and second hard mask 274. The first and second gate stacks 236a and 236b are under the coverage of the contact etch stop layer 280. It is understood that the material of the first hard masks 256a and 256b, second hard mask 274, and contact etch stop layer 280 may be the same. For example, when the first hard masks 256a and 256b are made of SiN, the second hard mask 274 and the contact etch stop layer 280 are made of SiN. There is no need to differentiate different materials among the first hard masks 256a and 256b, second hard mask 274 and contact etch stop layer 280 because of the second spacers 242a and 242b. An etching selectivity between the second spacers 242a and 242b and the contact etch stop layer 280 is greater than approximately 10. For example, when the second spacers 242a and 242b are made of ZrO, the contact etch stop layer 280 may be made of SiOC.

The first hard masks 256a and 256b, second hard mask 274 and contact etch stop layer 280 may include the same material. For example, when the first hard masks 256a and 256b are made of SiO, the second hard mask 274 and contact etch stop layer 280 may be made of SiO. Furthermore, an etching selectivity between the first hard masks 256a and 256b and the second spacers 242a and 242b is greater than approximately 10. Similarly, this etching selectivity applies to the relationships between the second hard mask 274 and the second spacers 242a and 242b, and between the contact etch stop layer 280 and the second spacers 242a and 242b. In some embodiments, the first hard masks 256a and 256b may have different materials from the second hard mask 274. When it comes to the etching selectivity between the hard mask and second spacer, the relationship should still be satisfied. For example, when the first hard masks 256a and 256b include SiO, and the second hard mask 274 include SiOC, the second spacers 242a and 242b may include a material of HfO, which shows an etching selectivity greater than approximately 10 in comparison with SiO and SiOC.

Reference is still made to FIG. 18. A second ILD layer 282 is deposited on the contact etch stop layer 280. The second ILD layer 282 is applied to the upper exposed surface of the contact etch stop layer 280. The second ILD layer 282 may include the same material as the first ILD layer 240 and is formed by similar method.

Figure 19:
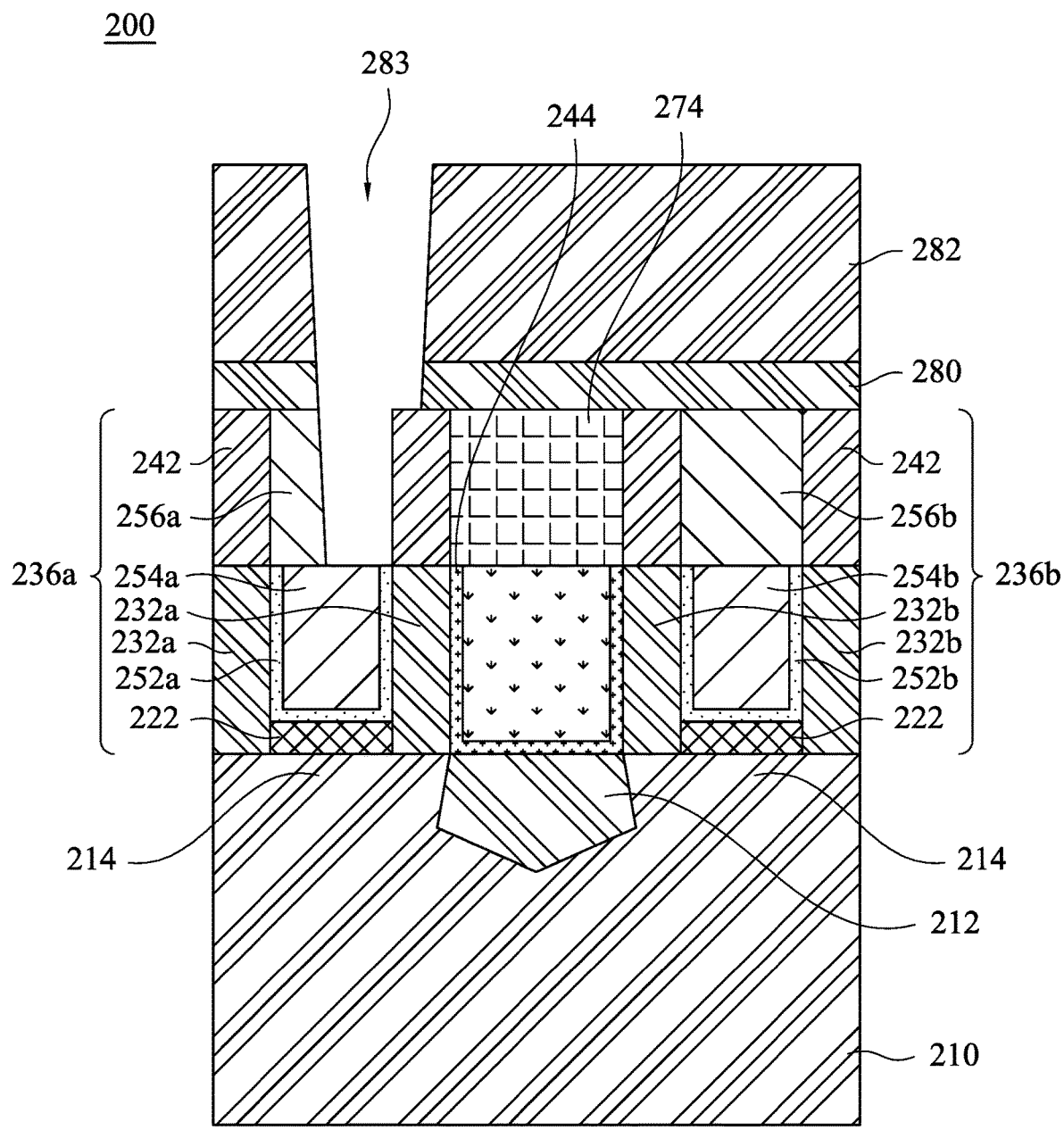

Reference is made to FIG. 19 and operation 140 in FIG. 1. A first contact hole 283 may be formed by any suitable process in the second ILD layer 282 and the first hard mask 256a. As one example, the formation of the first contact hole 283 may include patterning the second ILD layer 282 by a photolithography process, etching the exposed second ILD layer 282 (for example, by using a dry etching, wet etching, and/or plasma etching process) to remove portions of the second ILD layer 282 and the underlying first hard mask 256a over a portion of the metal gate electrode layer 254a. A portion of the first contact hole 283 goes through the second ILD layer 282 and the contact etch stop layer 280 and lands on one of the second spacer 242a without advancing. The remaining portion of the first contact hole 283 goes through the second ILD layer 282, contact etch stop layer 280, and further through a portion of the first hard mask 256a, therefore landing on the metal gate electrode layer 254a. The first contact hole has a stepped configuration, having the first flight on the second spacer 242a.

Figure 20:
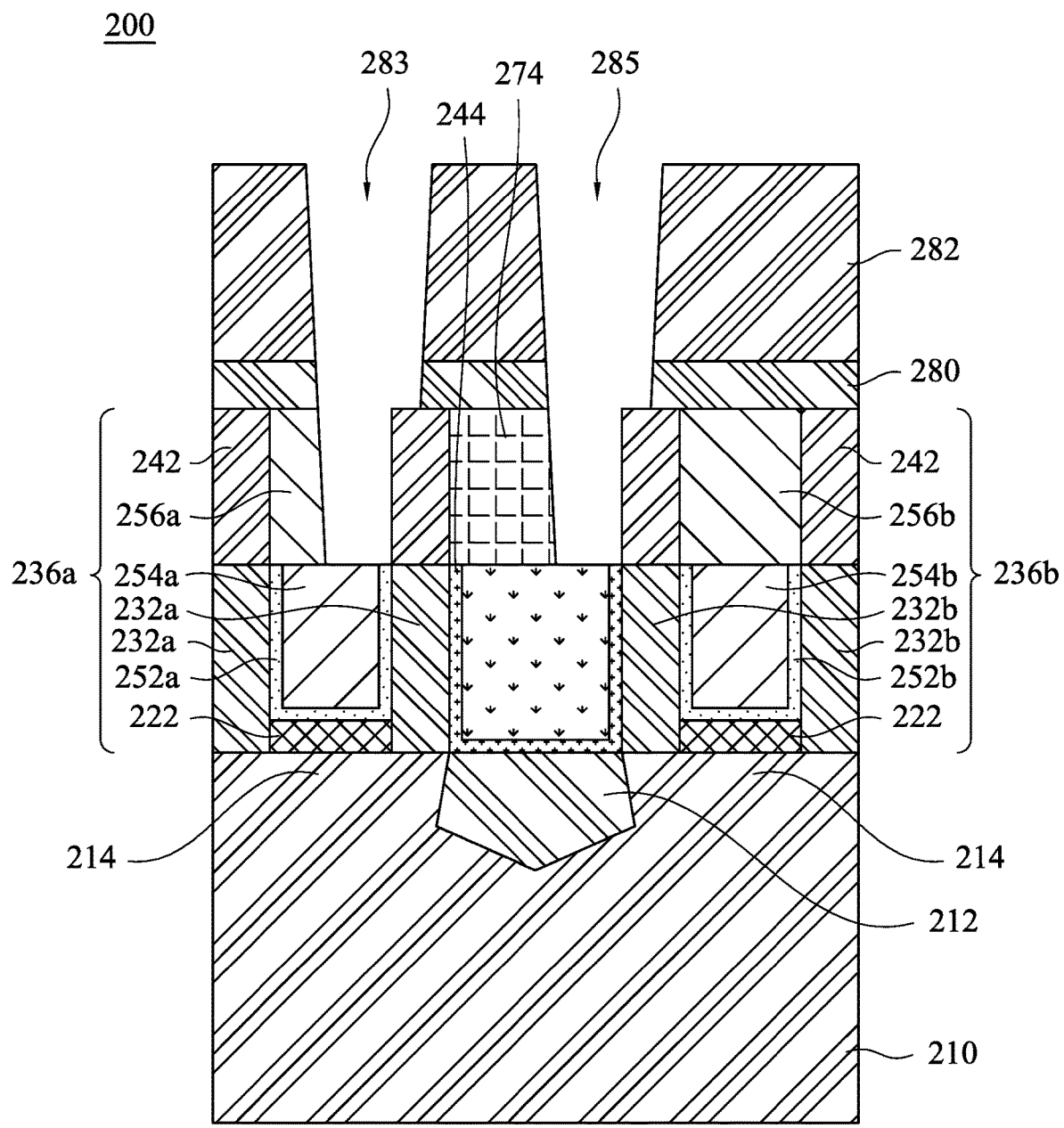

Reference is made to FIG. 20 and operation 140 of FIG. 1. A second contact hole 285 may be formed by any suitable process in the second ILD layer 282 and the second hard mask 274. As one example, the formation of the second contact hole 285 may include patterning the second ILD layer 282 by a photolithography process, etching the exposed second ILD layer 282 (for example, by using a dry etching, wet etching, and/or plasma etching process) to remove portions of the second ILD layer 282 and the underlying second hard mask 274 over a portion of the bottom conductive feature 272 (source/drain region 212). A portion of the second contact hole 285 goes through the second ILD layer 282 and the contact etch stop layer 280 and lands on the second spacers 242b without advancing. The remaining portion of the second contact hole 285 goes through the second ILD layer 282, contact etch stop layer 280, and further through a portion of the second hard mask 274, therefore landing on the bottom conductive feature 272. The second contact hole has a stepped configuration, having the first flight on the second spacer 242b.

Because an etching selectivity between the second spacers 242a and 242b and the contact etch stop layer 280 is greater than approximately 10, the first and second contact holes 283 and 285 do not go through the second spacers 242a and 242b. If the etching selectivity between the second spacers 242a and 242b and the contact etch stop layer 280 is less than approximately 10, the via etching process may lead to unwanted consumption of the underlying first spacers 232a and 232b. The first spacers 232a and 232b are well protected by the second spacers 242a and 242b. The formation of the first and second contact holes 283 and 285 does not compromise the integrity of the first spacers 232a and 232b because the second spacers 242a and 242b arrest the etching process so as to protect its underlying components. As a result, a portion of the second spacers 242a and 242b is exposed in the first and second contact holes 283 and 285 formation.

Reference is still made to FIG. 20. Due to the high etching selectivity between the contact etch stop layer 280 and the second spacers 242a and 242b, first spacers 232a and 232b are not exposed and well protected. The first spacers 232a and 232b are less prone to damage (consumption) during contact holes 283 and 285 formation because of the etching resistance provided by the second spacers 242a and 242b. A larger process window for the contact holes 283 and 285 can be achieved because the second spacers 232a and 232b can prevent the etching process from advancing further and retain the integrity of their underlying components. The positioning of the contact holes 283 and 285 is therefore having greater freedom.

In addition, the thickness of the first hard masks 256a and 256b can be thinner. More specifically, due to the etching selectivity the second spacers 242a and 242b are sufficient to protect the gate stacks 236a and 236b, such that the buffering function of the first hard masks 256a and 256b during etching is less sought after. Thinner first hard masks 256a and 256b imply a shorter gate height in general. The device dimension can be more compact.

Figure 21:
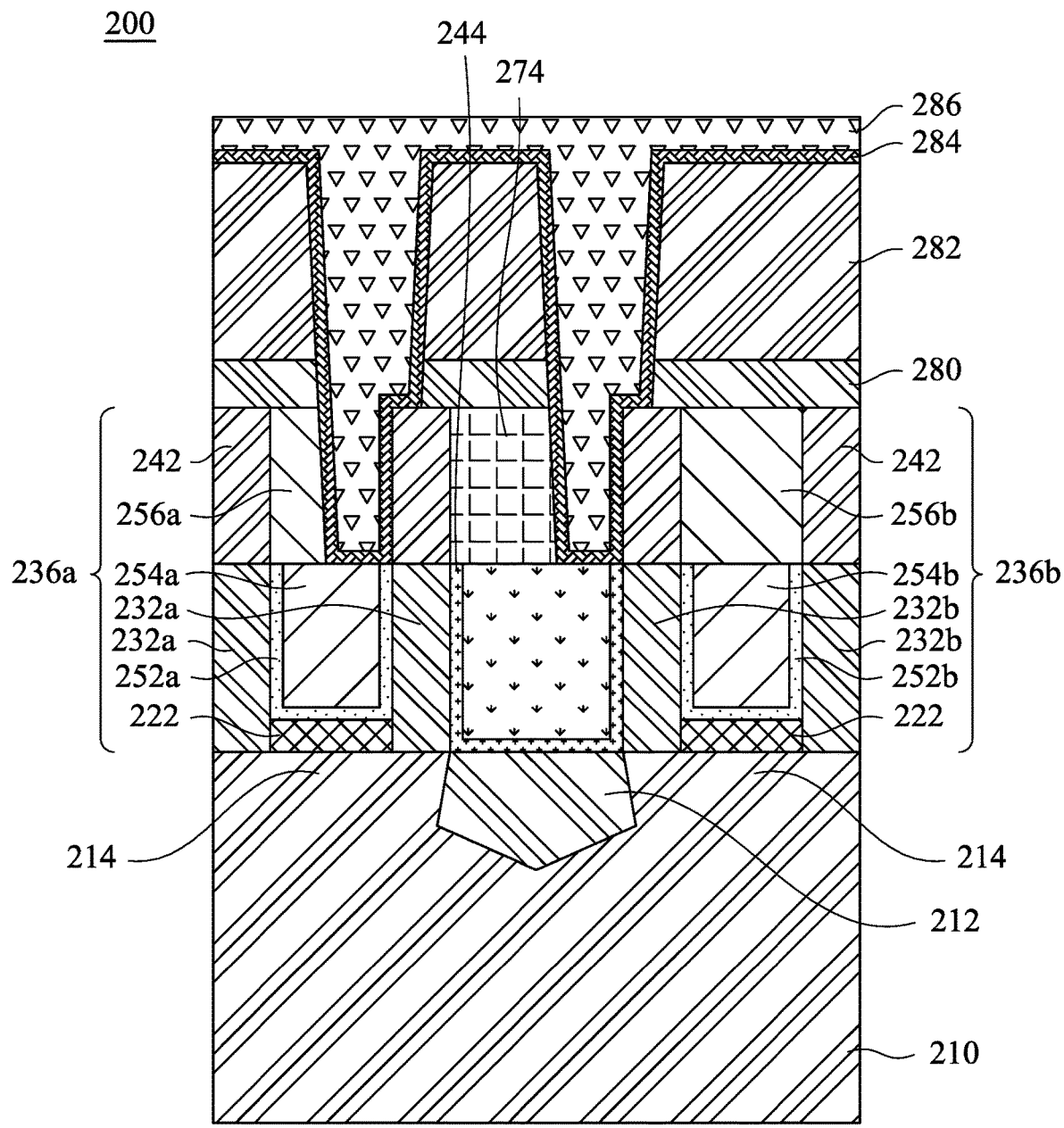

Reference is made to FIG. 21 and operation 150 of FIG. 1. A second barrier material layer 284 is deposited on the FinFET device 200. The second barrier material layer 284 lines the exposed top surface of the second spacers 242a and 242b, the sidewalls of the second ILD layer 282, top surface of the bottom conductive feature 272 (first barrier layer 244), top surface of the metal gate electrode layer 254a and the second hard mask 274. In some embodiment, the second barrier material layer 284 has a thickness of about 10 angstroms to about 300 angstroms. In some embodiments, the second barrier material layer 284 is a metal or metal alloy layer. The second barrier material layer 284 may include Co, Ag, Al, Zn, Ca, Au, Mg, W, Mo, Ni, Cr, or the like, which may be deposited by using e.g., PVD, CVD, PECVD, LPCVD, or the like.

Reference is still made to FIG. 21 and operation 150. A conductive material layer 286 fills in the contact holes 283 and 285. In some embodiments, the conductive material layer 286 includes TiN, TaN, Ta, Ti, Hf, Zr, Ni, W, Co, Cu, or Al. In some embodiments, the conductive material layer 286 may be formed by CVD, PVD, plating, ALD, or other suitable technique. The conductive material layer 286 adheres to the second barrier layer 284. The conductive material layer 286 is deposited until the contact holes 283 and 285 are over-filled as shown in FIG. 21.

Figure 22:
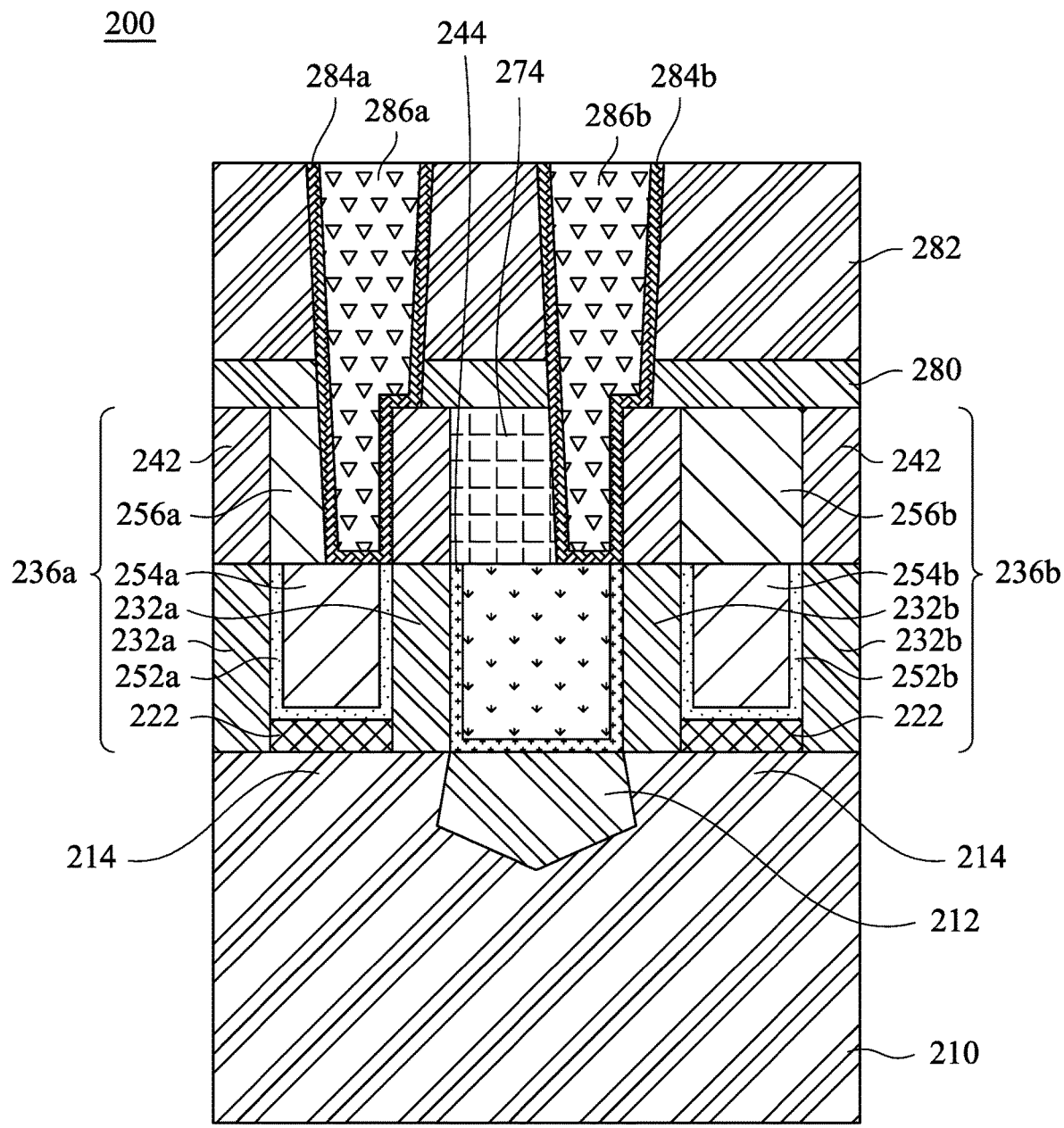

Reference is made to FIG. 22 and operation 150 of FIG. 1. Subsequently, CMP is performed to planarize the conductive material layer 286 and second barrier material layer 284 after filling the contact holes 283 and 285. The CMP removes a portion of the conductive material layer 286 and a portion of the second barrier layer 284 and a portion of the second ILD layer 282. After planarization, the first contact plug 286a and second contact plug 286b are formed. The first contact plugs 286a goes through the contact etch stop layer 280 and the first hard mask 256a to provide electrical contact to the metal gate electrode layer 254a. The second contact plug 286b goes through the contact etch stop layer 280 and second hard mask 274 to provide electrical contact to the bottom conductive feature 272 over the source/drain region 212.

The spacer of the gate stack is formed with two different materials showing etching selectivity larger than approximately 10. The first spacers are formed around the gate stack, and the second spacers replace half of the thickness of the first spacers. The second spacers are formed around the hard mask and serve as an etch stop layer itself. The first spacers may include low-k material so as to satisfy electrical property for the gate stack. The second spacers may include different materials from the first spacers. The etching selectivity between the first spacers and second spacers is larger than 10 such that during subsequent contact hole formation process, which includes etching process, the second spacers has the capability to endure the etching treatment and therefore protect the underlying first spacers. The overall gate height is reduced because the hard mask over the gate stack can be even thinner when its buffering function during etching is shared by the second spacers.

In some embodiments, a semiconductor device includes a semiconductor substrate, a source/drain over the semiconductor substrate, a bottom conductive feature over the source/drain, a gate structure over the semiconductor substrate, a first spacer between the gate structure and the bottom conductive feature, a second spacer over the first spacer, and a contact plug landing on the bottom conductive feature and the second spacer. A top surface of the gate structure is free from coverage by the second spacer.

In some embodiments, a semiconductor device includes a semiconductor substrate, a gate structure over the semiconductor substrate, a first spacer alongside the gate structure, a second spacer over the first spacer, and a contact plug landing on the gate structure and being spaced from a sidewall of the second spacer facing the contact plug.

In some embodiments, a method includes forming a gate structure over a semiconductor substrate with a first spacer alongside the gate structure, etching back the gate structure, etching back the first spacer, depositing a spacer material over the gate structure and the first spacer after etching back the gate structure, and etching a first portion of the spacer material to expose a top surface of the gate structure. A second portion of the spacer material remains over the first spacer to form a second spacer over the first spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductive substrate;
   a source/drain region extending into the semiconductive substrate;
   a source/drain contact metal landing on the source/drain region;
   a first spacer extending along a sidewall of the source/drain contact metal;
   a first gate structure extending along a sidewall of the first spacer facing away from the source/drain contact metal;
   a first gate hard mask atop the first gate structure;
   a second spacer extending upwardly from a top surface of the first spacer along a sidewall of the first gate hard mask; and
   a source/drain via plug extending upwardly from a top surface of the source/drain contact metal along a sidewall of the second spacer facing away from the first gate hard mask, the source/drain via plug being in contact with an entirety of the sidewall of the second spacer facing away from the first gate hard mask.

2. The semiconductor device of claim 1, wherein the source/drain via plug further extends along a partial region of a top surface of the second spacer.

3. The semiconductor device of claim 1, wherein the source/drain via plug further extends along a partial region of the top surface of the source/drain contact metal.

4. The semiconductor device of claim 1, further comprising:
- a third spacer extending along a sidewall of the source/drain contact metal facing away from the first spacer;
- a second gate structure extending along a sidewall of the third spacer facing away from the source/drain contact metal;
- a fourth spacer extending upwardly from a top surface of the third spacer; and
- a gate via plug extending upwardly from a top surface of the second gate structure along a sidewall of the fourth spacer.

5. The semiconductor device of claim 4, wherein the gate via plug further extends along a partial region of a top surface of the fourth spacer.

6. The semiconductor device of claim 4, wherein the gate via plug further extends along a partial region of the top surface of the second gate structure.

7. The semiconductor device of claim 4, wherein the source/drain via plug is spaced from the fourth spacer.

8. The semiconductor device of claim 1, wherein the first spacer has a top width at a top end of the first spacer, the second spacer has a top width at a top end of the second spacer, and the top width of the first spacer is the same as the top width of the second spacer.

9. A semiconductor device, comprising:
- a semiconductive substrate;
- a gate structure over the semiconductive substrate;
- a first spacer alongside the gate structure;
- a second spacer extending upwardly from a top surface of the first spacer;
- a gate hard mask extending upwardly from a top surface of the gate structure along a sidewall of the second spacer; and
- a gate via plug extending upwardly from the top surface of the gate structure along a sidewall of the gate hard mask facing away from the second spacer, wherein the gate hard mask has opposite sidewalls in contact with the gate via plug and the second spacer, respectively.

10. The semiconductor device of claim 9, further comprising:
- a third spacer extending along a sidewall of the gate structure facing away from the first spacer; and
- a fourth spacer extending upwardly from a top surface of the third spacer, wherein the gate via plug further extends along a partial region of a top surface of the fourth spacer.

11. The semiconductor device of claim 10, further comprising:
- a source/drain region extending into the semiconductive substrate;
- a source/drain contact metal landing on the source/drain region;
- a source/drain hard mask extending upwardly from a top surface of the source/drain contact metal along a sidewall of the fourth spacer facing away from the gate via plug; and
- a source/drain via plug extending upwardly from the top surface of the source/drain contact metal along a sidewall of the source/drain hard mask facing away from the fourth spacer.

12. The semiconductor device of claim 11, wherein the source/drain hard mask has a top surface coterminous with a top surface of the fourth spacer.

13. A method, comprising:
- forming first spacers respectively on opposite sides of a dummy gate structure over a semiconductive substrate;
- forming a source/drain region in the semiconductive substrate after forming the first spacers;
- forming a first interlayer dielectric (ILD) layer alongside the first spacers and covering the source/drain region;
- replacing the dummy gate structure with a metal gate structure;
- etching back the metal gate structure;
- etching back the first spacers;
- depositing a spacer material to line a recess defined by a sidewall of the first ILD layer and top surfaces of the etched back metal gate structure and the etched back first spacers; and
- etching a first portion of the spacer material to expose a top surface of the etched back gate structure, wherein second portions of the spacer material remain respectively over the etched back first spacers after etching the first portion of the spacer material;
- after etching the first portion of the spacer material, etching the first ILD layer until the source/drain region is exposed; and
- forming a source/drain contact metal over the source/drain region after etching the first ILD layer.

14. The method of claim 13, wherein etching back the metal gate structure is performed prior to etching back the first spacers.

15. The method of claim 13, further comprising:
etching back the source/drain contact metal.

16. The method of claim 15, further comprising:
depositing a hard mask into a recess defined by sidewalls of the second portions of the spacer material and a top surface of the etched back source/drain contact metal.

17. The method of claim 16, further comprising:
- etching the hard mask to form a via hole that exposes the source/drain contact metal; and
- depositing a conductive material into the via hole.

18. The method of claim 13, further comprising:
after etching the first portion of the spacer material, depositing a hard mask into a recess defined by sidewalls of the second portions of the spacer material and a top surface of the etched back metal gate structure.

19. The method of claim 18, further comprising:
- etching the hard mask to form a via hole that exposes the metal gate structure; and
- depositing a conductive material into the via hole.

20. The method of claim 18, further comprising:
- forming an etch stop layer extending along a top surface of the hard mask and top surfaces of the second portions of the spacer material;
- forming a second ILD layer over the etch stop layer;
- etching the second ILD layer, the etch stop layer and the hard mask to form a via hole that exposes the metal gate structure; and
- depositing a conductive material into the via hole.

* * * * *